United States Patent
Chen et al.

(10) Patent No.: US 12,444,368 B2
(45) Date of Patent: Oct. 14, 2025

(54) DISPLAY BACKPLANE AND MANUFACTURING METHOD THEREOF AND DISPLAY DEVICE

(71) Applicant: BOE TECHNOLOGY GROUP CO., LTD., Beijing (CN)

(72) Inventors: Liang Chen, Beijing (CN); Ke Wang, Beijing (CN); Haoliang Zheng, Beijing (CN); Minghua Xuan, Beijing (CN); Dongni Liu, Beijing (CN); Hao Chen, Beijing (CN); Qi Qi, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 663 days.

(21) Appl. No.: 17/789,193

(22) PCT Filed: Aug. 16, 2021

(86) PCT No.: PCT/CN2021/112692
§ 371 (c)(1),
(2) Date: Jun. 25, 2022

(87) PCT Pub. No.: WO2022/057542
PCT Pub. Date: Mar. 24, 2022

(65) Prior Publication Data
US 2023/0043192 A1    Feb. 9, 2023

(30) Foreign Application Priority Data
Sep. 15, 2020   (CN) .......................... 202010968648.3

(51) Int. Cl.
*H10K 59/131*   (2023.01)
*G09G 3/3233*   (2016.01)
(Continued)

(52) U.S. Cl.
CPC ......... *G09G 3/3258* (2013.01); *G09G 3/3233* (2013.01); *H01L 24/05* (2013.01);
(Continued)

(58) Field of Classification Search
None
See application file for complete search history.

(56) References Cited

U.S. PATENT DOCUMENTS

2013/0271677 A1   10/2013 Koo
2018/0197885 A1*  7/2018 Lee ..................... G09G 3/3266
(Continued)

FOREIGN PATENT DOCUMENTS

CN   108369788 A   8/2018
CN   109727534 A   5/2019
(Continued)

OTHER PUBLICATIONS

European Patent Office, Supplementary Partial European Search Report, issued on Jan. 23, 2024, App. No. EP21868370.4.
(Continued)

*Primary Examiner* — Benjamin P Sandvik
(74) *Attorney, Agent, or Firm* — HOUTTEMAN LAW LLC

(57) ABSTRACT

A display backplane is provided, including a base, wherein pixel circuits, bonding electrodes, and bonding connection wires are on the base; the bonding electrodes are coupled to the bonding connection wires in a one-to-one correspondence; the bonding electrodes and the bonding connection wires are on two opposite surfaces of the base; the pixel circuits and the bonding connection wires are on a same side of the base; one end of each bonding connection wire is coupled to the bonding electrode through the first via in the base; the other end of each of at least some bonding connection wires is coupled to the pixel circuit; and an
(Continued)

orthographic projection of at least one of the bonding electrodes and the bonding connection wires on the base is not coincident with an orthographic projection of the pixel circuit on the base.

19 Claims, 8 Drawing Sheets

(51) Int. Cl.
| | |
|---|---|
| *G09G 3/3258* | (2016.01) |
| *H01L 23/00* | (2006.01) |
| *H01L 25/16* | (2023.01) |
| *H10D 86/01* | (2025.01) |
| *H10D 86/40* | (2025.01) |
| *H10D 86/60* | (2025.01) |
| *G11C 19/28* | (2006.01) |

(52) U.S. Cl.
CPC ............ *H01L 24/06* (2013.01); *H01L 25/167* (2013.01); *H10D 86/0214* (2025.01); *H10D 86/441* (2025.01); *H10D 86/60* (2025.01); *G09G 2300/0426* (2013.01); *G09G 2300/0819* (2013.01); *G09G 2300/0852* (2013.01); *G09G 2310/0286* (2013.01); *G09G 2310/08* (2013.01); *G09G 2320/0233* (2013.01); *G11C 19/287* (2013.01); *H01L 2224/05553* (2013.01); *H01L 2224/05567* (2013.01); *H01L 2224/05571* (2013.01); *H01L 2224/05573* (2013.01); *H01L 2224/05582* (2013.01); *H01L 2224/05624* (2013.01); *H01L 2224/05647* (2013.01); *H01L 2224/05666* (2013.01); *H01L 2224/0568* (2013.01); *H01L 2224/06182* (2013.01)

(56) References Cited

U.S. PATENT DOCUMENTS

| | | |
|---|---|---|
| 2019/0294214 A1 | 9/2019 | Mathew et al. |
| 2020/0098307 A1 | 3/2020 | Li et al. |
| 2020/0111978 A1 | 4/2020 | Kim et al. |
| 2020/0127073 A1* | 4/2020 | Ke ..................... H10D 86/441 |
| 2020/0219961 A1* | 7/2020 | Managaki ............ H10K 59/131 |
| 2022/0199650 A1* | 6/2022 | Wang .................. H10D 86/441 |

FOREIGN PATENT DOCUMENTS

| | | |
|---|---|---|
| CN | 110034150 A | 7/2019 |
| CN | 110600487 A | 12/2019 |
| CN | 110707120 A | 1/2020 |
| CN | 110752223 A | 2/2020 |
| CN | 111309184 A | 6/2020 |
| CN | 111524914 A | 8/2020 |
| JP | H 06222741 A | 8/1994 |
| JP | H 11133448 A | 5/1999 |
| JP | 2015184358 A | 10/2015 |
| JP | 2018534613 A | 11/2018 |
| JP | 2019500703 A | 1/2019 |
| WO | 2019084077 A1 | 5/2019 |

OTHER PUBLICATIONS

China Patent Office, First Office Action, Feb. 18, 2025, for corresponding CN application No. 202010968648.3.

* cited by examiner

DISPLAY BACKPLANE AND MANUFACTURING METHOD THEREOF AND DISPLAY DEVICE

CROSS REFERENCE TO RELATED APPLICATIONS

This is a National Phase Application filed under 35 U.S.C. 371 as a national stage of PCT/CN2021/112692, filed on Aug. 16, 2021, an application claiming the benefit of priority to Chinese Patent Application No. 202010968648.3 filed on Sep. 15, 2020.

TECHNICAL FIELD

Embodiments of the present disclosure relates to the field of display technology, in particular to a display backplane and a manufacturing method thereof and a display device.

BACKGROUND

In recent years, full-screen and no-bezel stitching display become an important development direction of a high-end mobile display. In order to achieve the full-screen and no-bezel stitching display, it is necessary to communication signals on a front side with signals on a back side of a substrate. Currently, the substrate mainly includes a glass substrate and a polyimide (PI) substrate. In order to achieve the communication of signals on the front side with signals on the back side, vias are usually required to be formed in the substrate. It cannot realize a flexible display in the glass substrate, so that Through PI Vias (TPV) is a better method for achieving the full-screen and no-bezel stitching display.

SUMMARY

The embodiment of the present disclosure provides a display backplane and a manufacturing method thereof and a display device.

In a first aspect, an embodiment of the present disclosure provides a display backplane, including a base, and a plurality of pixel circuits, a plurality of bonding electrodes, and a plurality of bonding connection wires on the base, wherein the plurality of bonding electrodes are coupled to the plurality of bonding connection wires in a one-to-one correspondence; the plurality of bonding electrodes and the plurality of bonding connection wires are on two opposite surfaces of the base, respectively, the plurality of pixel circuits and the plurality of bonding connection wires are on a same side of the base;
one end of each of the plurality of bonding connection wires is coupled to the bonding electrode through a first via in the base; the other end of each of at least some of the plurality of bonding connection wires is coupled to the pixel circuit; and an orthographic projection of at least one of the plurality of bonding electrodes and the plurality of bonding connection wires on the base is not coincident with an orthographic projection of the pixel circuit on the base.

In some embodiments, the display backplane further includes a plurality of dummy circuits on the base, wherein the orthographic projection of at least one of the plurality of bonding electrodes and the plurality of bonding connection wires on the base overlaps an orthographic projection of at least one of the plurality of dummy circuits on the base.

In some embodiments, the dummy circuit has a same circuit structure as the pixel circuit.

In some embodiments, the display backplane further includes a plurality of light emitting elements arranged in a uniform array, wherein the plurality of pixel circuits are coupled to the plurality of light emitting elements in a one-to-one correspondence; in an array of the plurality of pixel circuits, every n adjacent rows of pixel circuits form a pixel circuit group; where n is an integer, and $2 \leq n \leq 5$; a distance between any two adjacent rows of the light emitting elements along a column direction in which the plurality of pixel circuits are arranged is M, and in the pixel circuit group, a distance S between any two adjacent rows of the pixel circuits satisfies: $0 < S \leq M$; and a length of the bonding electrode along the column direction in which the plurality of pixel circuits are arranged is L, and a distance T between two adjacent pixel circuit groups satisfies: $M < T \leq (2 \cdot p + 1) \cdot M$, where $p = [L/M]$.

In some embodiments, the plurality of dummy circuits are arranged in a uniform array, every n adjacent rows of the dummy circuits form a dummy circuit group, where n is an integer, and $2 \leq n \leq 5$; and in the dummy circuit group, a distance G between any two adjacent rows of the dummy circuits satisfies: $0 < G \leq M$.

In some embodiments, wherein a distance H between the dummy circuit group and the pixel circuit group adjacent thereto satisfies: $M < H \leq 2M$; and a distance X between any two adjacent dummy circuit groups satisfies: $M < X \leq 2M$.

In some embodiments, an orthographic projection of the first via on the base is within an orthographic projection of an end of the bonding electrode on the base.

In some embodiments, the first via includes a plurality of first vias, the plurality of first vias are at two ends of the bonding electrode, respectively; and the plurality of first vias are sequentially arranged along a length direction of the bonding electrode.

In some embodiments, the first via includes N first vias, N is an even number, N/2 of the N first vias are correspondingly disposed at one end of the bonding electrode, and the other N/2 of the N first vias are correspondingly disposed at the other end of the bonding electrode.

In some embodiments, the plurality of pixel circuits are on a side of the plurality of bonding connection wires away from the base, the display backplane further includes a first insulating layer between the plurality of pixel circuits and the plurality of bonding connection wires, the first insulating layer is provided with a second via therein, and the pixel circuit is coupled to the bonding connection wire through the second via.

In some embodiments, the display backplane further includes a shift register on a side of the bonding connection wire away from the base, wherein an orthographic projection of the shift register on the base is at least partially within an orthographic projection of the bonding electrode for providing a signal to the shift register on the base; and one end of the shift register is coupled to the bonding electrode through the bonding connection wire, and the other end of the shift register is coupled to the pixel circuit.

In some embodiments, the shift register is in the same layer as the plurality of pixel circuits, and is between two adjacent columns of pixel circuits; the first insulating layer further extends between the shift register and the bonding connection wire, the first insulating layer is further provided with a third via therein, and the shift register is coupled to the bonding connection wire through the third via, so as to be coupled to the bonding electrode through the bonding connection wire.

In some embodiments, the display backplane further includes a data selection circuit, wherein an orthographic projection of the data selection circuit on the base partially overlaps an orthographic projection of the bonding connection wire on the base, one end of the data selection circuit is coupled to the bonding electrode through the bonding connection wire, and the other end of the data selection circuit is coupled to a data line; and the data line is configured to couple the pixel circuit to the data selection circuit.

In some embodiments, the data selection circuit is on a side of the plurality of bonding connection wires away from the base, the data selection circuit is on a same layer as the plurality of pixel circuits, the data selection circuit, the plurality of pixel circuits and the shift register are not aligned with each other; the first insulating layer further extends between the data selection circuit and the plurality of bonding connection wires,
the first insulating layer is provided with a fourth via therein, and the data selection circuit is coupled to the bonding connection wire through the fourth via, so as to be coupled to the bonding electrode through the bonding connection wire.

In some embodiments, the plurality of bonding electrodes are arranged along a row direction in which the plurality of pixel circuits are arranged, and a length direction of each of the plurality of bonding electrodes is parallel to a column direction in which the plurality of pixel circuits are arranged; and a shape of the data selection circuit includes a long strip shape, and a length direction of the data selection circuit is parallel to the row direction in which the plurality of pixel circuits are arranged.

In some embodiments, the data selection circuit includes a plurality of data selection circuits parallel to each other and sequentially arranged along the column direction in which the plurality of pixel circuits are arranged.

In some embodiments, the pixel circuit includes at least a capacitor and a thin film transistor electrically coupled to each other.

In a second aspect, an embodiment of the present disclosure further provides a display device, including the above display backplane.

In a third aspect, an embodiment of the present disclosure further provides a manufacturing method for a display backplane, including: sequentially preparing a plurality of bonding electrodes, a base, a first via in the base, a plurality of bonding connection wires, and a plurality of pixel circuits on a substrate; wherein the plurality of bonding electrodes are coupled to the plurality of bonding connection wires in a one-to-one correspondence; the plurality of bonding electrodes and the plurality of bonding connection wires are on two opposite surfaces of the base, respectively, the plurality of pixel circuits and the plurality of bonding connection wires are on a same side of the base;
one end of each of the plurality of bonding connection wires is coupled to the bonding electrode through the first via; the other end of each of at least some of the plurality of bonding connection wires is coupled to the pixel circuit; and an orthographic projection of at least one of the plurality of bonding electrodes and the plurality of bonding connection wires on the base is not coincident with an orthographic projection of the pixel circuit on the base.

In some embodiments, the method further includes a step of peeling off the substrate.

BRIEF DESCRIPTION OF DRAWINGS

The accompanying drawings, which are provided for further understanding of the present disclosure and constitute a part of this specification, are for explaining the present disclosure together with the following exemplary embodiments, but are not intended to limit the present disclosure. The above and other features and advantages will become more apparent to one of ordinary skill in the art by describing detailed exemplary embodiments thereof with reference to the drawings. In the drawings.

Figure 1:
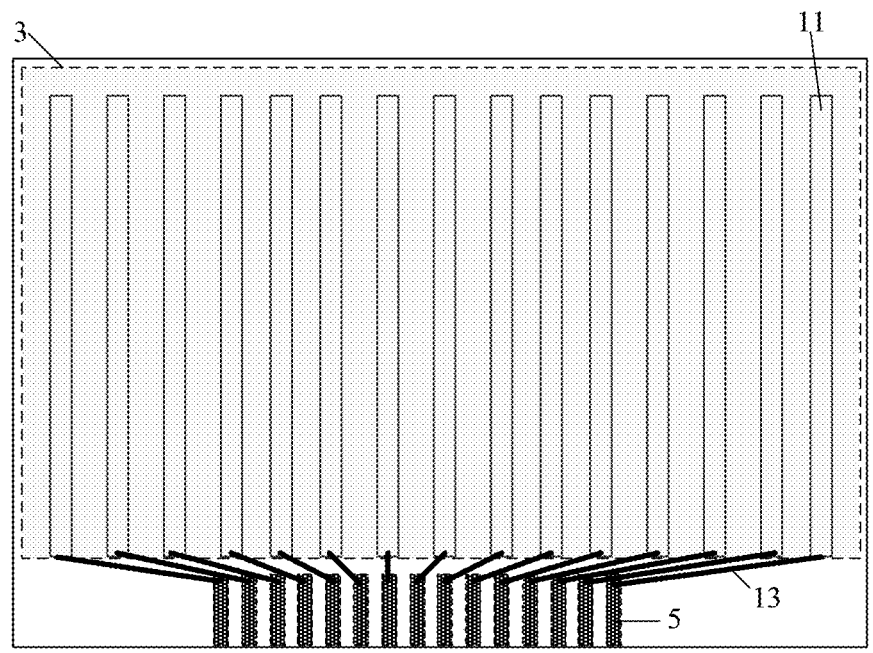
FIG. 1 is a schematic diagram of an architecture of signal lines of a display panel in the related art.

Reference symbols are:
1. Bonding Region; 2. Bonding Wiring Region; 3. Display Region; 4. Shift Register; 5. Bonding Electrode; 6. Bonding Connection Wire; 7. Pixel Circuit; 70/70'/70". Pixel Circuit Group; 8. Pixel; 9. First Via; 91. Side; 10. Data Selection Circuit; 11. Signal Line; 12. Dummy Circuit; 120. Dummy Circuit Group; 13. Fan-Out Wire; 130. Fan-Out Wire Region; 100. Region Having Uneven Brightness; 14. Driving Circuit; 15. Data Line; 16. Transistor; 160. First Gate Electrode; 161. Second Gate Electrode; 162. Active Layer; 163. Source Electrode; 164. Drain Electrode; 17. Base; 171. First Side; 172. Second Side; 18. Relay Wire; 19. Recess; 20. Insulating Layer; 21. Additional Insulating Layer; 210. Passivation Layer; 211. Blocking Layer; 212. Buffer Layer; 22. First Gate Insulating Layer; 23. Second Gate Insulating Layer; 24. Interlayer Dielectric Layer; 25. Light Emitting Element; 26. First Planarization Layer; 27. Second Planarization Layer; 28. Second Passivation Layer; 29. First Contact Pad; 30. Second Contact Pad; 31. Base Via; 32. Third Passivation Layer; 33. Fifth Via; 34. Sixth Via.

DETAIL DESCRIPTION OF EMBODIMENTS

In order to enable one of ordinary skill in the art to better understand the technical solutions of the embodiments of the present disclosure, a display backplane and a manufacturing method thereof and a display device of the embodiments of the present disclosure will be described in further detail with reference to the accompanying drawings and the detailed description.

The embodiments of the present disclosure will be described more fully hereinafter with reference to the accompanying drawings, but the embodiments shown may be embodied in different forms and should not be construed to limit the embodiments set forth herein. Rather, these embodiments are provided so that the present disclosure will be thorough and complete, and will fully convey the scope of the present disclosure to one of ordinary skill in the art.

The embodiments of the present disclosure are not limited to the embodiments shown in the drawings, but include modifications of configurations formed based on a manufacturing process. Thus, regions illustrated in the drawings have schematic properties, and shapes of the regions shown in the drawings illustrate specific shapes of the regions, but are not intended to be limited.

In the related art, signal wirings are all disposed on one surface of a display substrate. As shown in FIG. 1, in a non-display region of the display substrate, signal lines 11 (such as data lines, power lines, etc.) in a display region 3 are coupled to bonding electrodes 5 through fan-out wires 13. In a module process, the bonding electrodes 5 are electrically coupled to a driving chip (IC) through a flexible printed circuit (FPC) or a chip on film (COF).

Figure 2:
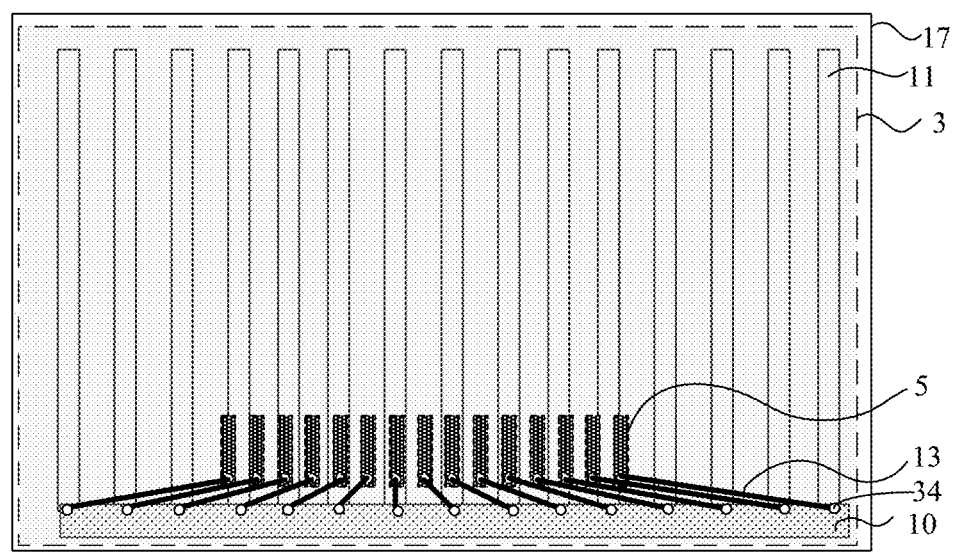
FIG. 2 is a schematic diagram of an architecture of signal lines of a no-bezel substrate with the Through PI Vias in the related art.
Figure 3:
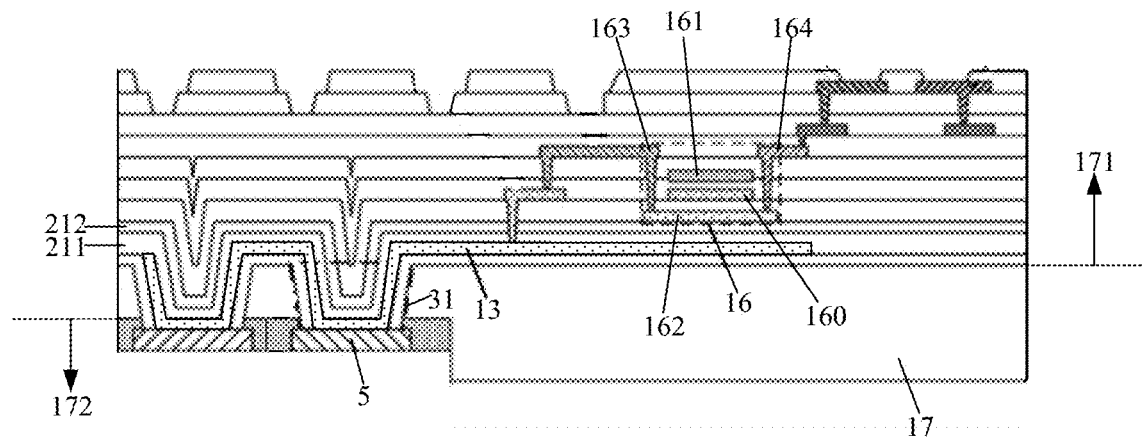
FIG. 3 is a schematic diagram illustrating overlapping of fan-out wires and an active layer of a transistor of a no-bezel substrate with the Through PI Vias in the related art.

It provides an implementation of a narrow-bezel display substrate in the related art. As shown in FIG. 2 and FIG. 3, a display substrate includes a base 17, bonding electrodes 5 disposed on a second side 172 of the base 17, and fan-out wires 13, driving circuits and other metal layers sequentially disposed on a first side 171 of the base 17. Each sub-pixel corresponds to one driving circuit; the driving circuits are uniformly arranged in an array; and the driving circuit includes at least one transistor 16. The first side 171 and the second side 172 are two opposite surfaces of the base 17. The transistor 16 includes a first gate electrode 160, a second gate electrode 161, an active layer 162, a source electrode 163 electrically coupled to the active layer 162, and a drain electrode 164 electrically coupled to the active layer 162; the fan-out wires 13, the conductive layers in the transistors 16, and other metal layers are separated from each other by insulating layers. The bonding electrodes 5 are disposed in the display region 3. The signal lines 11 are routed through a source-drain metal layer in a transistor (TFT) or other metal layers (generally, metal having a low resistance such as Ti/Al/Ti laminate, Cu, etc.) above the source-drain metal layer, and are coupled to the fan-out wires 13 through vias in an insulating layer located at an edge of the display substrate; the fan-out wires 13 are coupled to the bonding electrodes 5 located in the display region 3 through base vias 31 located in the display region 3; an orthographic projection of the base via 31 on the base 17 overlaps with an orthographic projection of a corresponding bonding electrode 5 on the base 17; the bonding electrodes 5 are electrically coupled to the driving chip (IC) or other signal sources through the flexible printed circuit or the chip on film, thereby transmitting electrical signal from a peripheral circuit signal source, such as the driving chip or a power supply, to electrical devices in the display substrate. A material of the base 17 may be a flexible material such as polyimide, or a rigid material such as glass or quartz.

For a high-resolution display panel, the number of output data signal channels of the driving chip is limited, and is usually increased by using a data selection circuit, so as to solve the problem that the number of output data signal channels of the driving chip does not match with the number of signal lines of the display panel. In the related art, as shown in FIG. 2, the data selection circuit 10 is also disposed at the edge of the display panel, and is coupled to the fan-out wires 13 through sixth vias 34 in the insulating layer at the edge of the display substrate.

Figure 4:
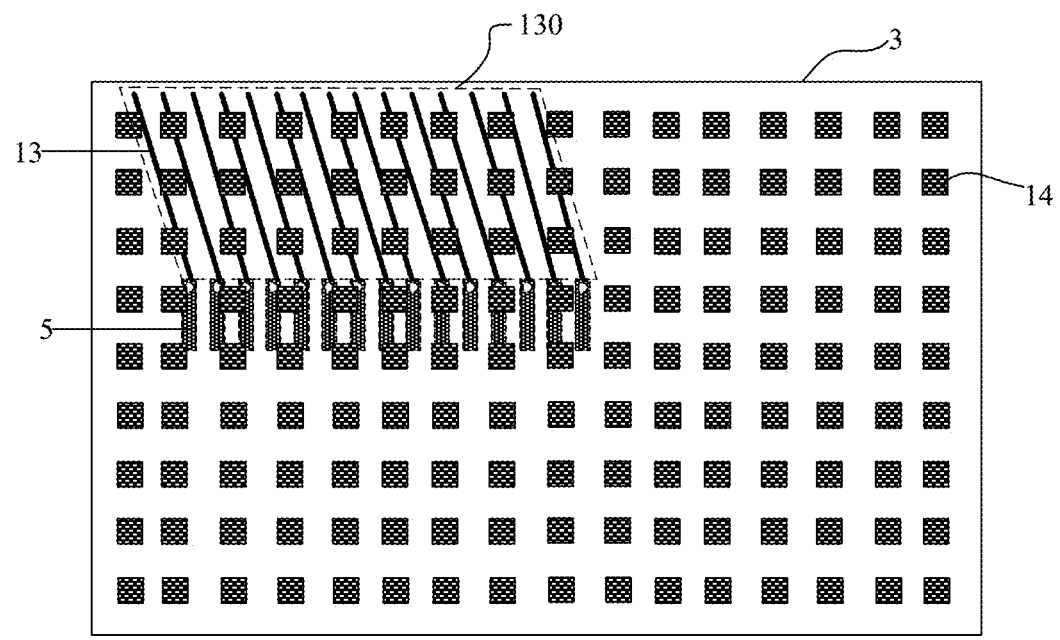
FIG. 4 is a schematic diagram of an arrangement of driving circuits and fan-out wires of a no-bezel substrate with the Through PI Vias in the related art.
Figure 5:
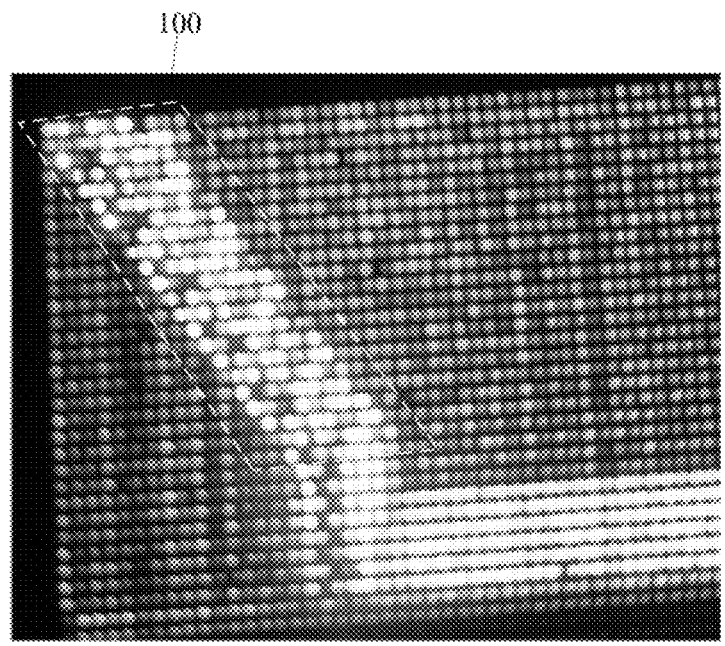
FIG. 5 is a schematic diagram illustrating non-uniformity of display brightness of the display panel caused by the arrangement of the driving circuits and the fan-out wires in FIG. 4.

In a no-bezel substrate provided in the related art, as shown in FIG. 3 and FIG. 4, the fan-out wires 13 need to be coupled to the bonding electrodes 5 in the middle of the display region 3 and the data selection circuit located at the edge of the display substrate. In a case where a route distance is long and the number of signal channels is great, the fan-out wires 13 are densely arranged and overlap an orthographic projection of the active layer 162 (which may be made of low-temperature polysilicon or semiconductor oxide material) of the transistor 16 in the driving circuit 14 in the display region 3. As an example, the substrate is provided with the active layer 162 of the transistor made of the low-temperature polysilicon, the fan-out wire 13 is located in the display region 3 and separated from the active layer 162 of the low-temperature polysilicon by a buffer layer 212 and a blocking layer 211 (with a total thickness of about 0.9 μm), but a large coupling effect still occurs between the fan-out wire 13 and the active layer 162 due to the overlapping of the orthographic projections of the fan-out wire 13 and the active layer 162, which results in a phenomenon of uneven brightness occurred when the display panel displays. Comparing FIG. 4 with FIG. 5, it may be seen that an uneven-brightness region (a region having uneven brightness) 100 and a fan-out wire region 130 have the same profile, mainly because the fan-out wire 13 is located under the active layer 162 of the transistor 16, and the orthographic projections of the fan-out wire 13 and the active layer 162 overlap with each other, which affects the crystallization of the active layer 162 made of polysilicon. In addition, electrical signals on the fan-out wire 13 may also be coupled to a gate voltage of the transistor 16, which results in an abnormal pixel current and affects the brightness uniformity of the display panel.

Aiming at the problem that the display brightness of the display panel is uneven due to the fact that the fan-out wire overlaps with the active layer or the gate electrode of the transistor, the embodiment of the present disclosure provides a display backplane, a manufacturing method for a display backplane and a display device.

Figure 6:
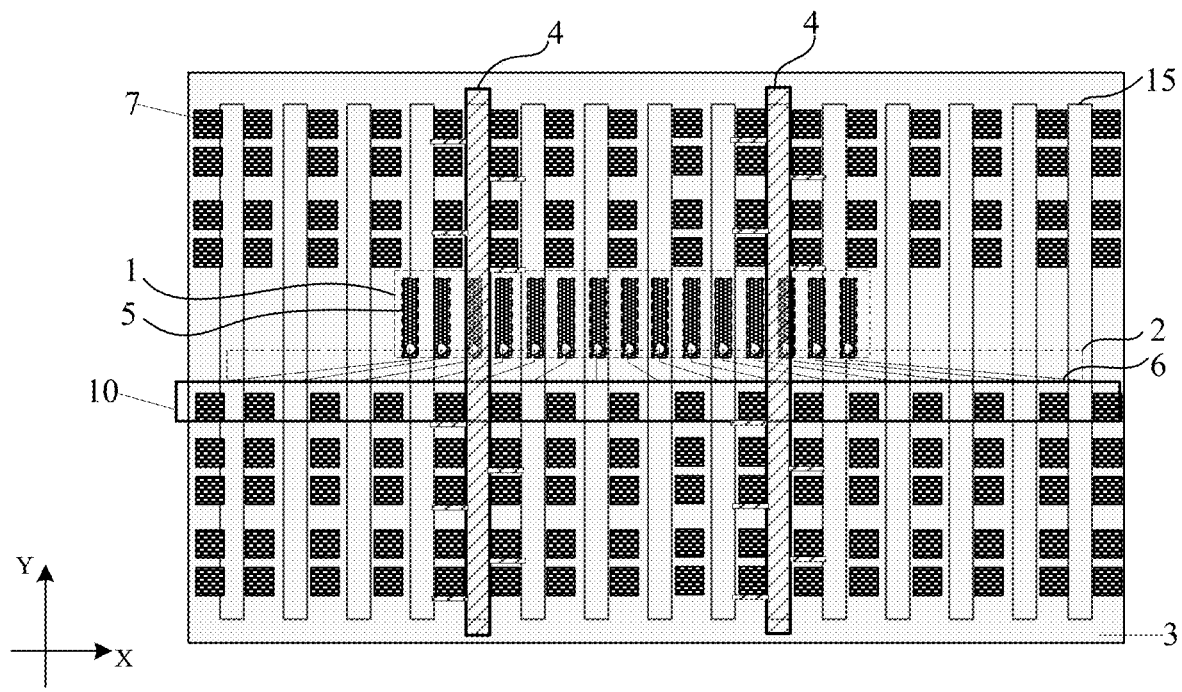
FIG. 6 is a schematic top view of an architecture of signal lines of a display backplane according to an embodiment of the present disclosure.

The embodiment of the present disclosure provides a display backplane. As shown in FIG. 6, the display backplane includes a base, a plurality of pixel circuits 7, a plurality of bonding electrodes 5, and a plurality of bonding connection wires 6 are disposed on the base; the plurality of bonding electrodes 5 are coupled to the plurality of bonding connection wires 6 in a one-to-one correspondence; the plurality of bonding electrodes 5 and the plurality of bonding connection wires 6 are positioned on two opposite surfaces of the base, respectively, and the plurality of pixel circuits 7 and the plurality of bonding connection wires 6 are positioned on the same side of the base; one end of the bonding connection wire 6 is coupled to a corresponding bonding electrode 5 through a corresponding first via formed in the base; the other end of each of at least some of the plurality of bonding connection wires 6 is coupled to the pixel circuit 7; an orthographic projection of at least one of the plurality of bonding electrodes 5 and the plurality of bonding connection wires 6 on the base is not coincident with an orthographic projection of the pixel circuits 7 on the base.

In some embodiments, the display backplane includes a bonding region 1, a bonding wiring region 2, and a display region 3, where the bonding region 1 is adjacent to the bonding wiring region 2, and the bonding region 1 and the bonding wiring region 2 are located in the display region 3; the bonding electrodes 5 are positioned in the bonding region 1; the bonding connection wires 6 are positioned in the bonding wiring region 2; the pixel circuits 7 are located in the regions of the display region 3 than the bonding region 1 and the bonding wiring region 2. The base may be made of polyimide materials, so as to achieve flexible display.

The display region 3 is a region on the backplane where an image is actually displayed. The pixel circuit 7 is a circuit for driving a light emitting element to emit light, the light emitting element may be a micro inorganic light emitting diode or an organic light emitting diode. The bonding electrode 5 is used for bonding a peripheral circuit, one end of the bonding connection wire 6 is coupled to the bonding electrode 5, and the other end of the bonding connection wire is coupled to the pixel circuit 7, so that signals (including driving signals, power signals, control signals, clock signals and the like) provided by the peripheral circuit may be provided to the pixel circuit 7, and thereby the pixel circuit 7 drives the sub-pixels to display. The pixel circuit 7 is a circuit formed by a capacitor and a plurality of electronic components such as transistors connected with each other. The bonding region 1 and the bonding wiring region 2 are located in the display region 3, so that the display panel by adopting the display backplane realizes the full-screen or no-bezel display.

The orthographic projection of at least one of the plurality of bonding electrodes 5 and the plurality of bonding connection wires 6 on the base is not coincident (or overlapping) with the orthographic projection of the pixel circuits 7 on the base, so that the bonding electrodes 5 and the bonding connection wires 6 may be prevented from overlapping the active layers, the gate electrodes and the like of the transistors in the pixel circuits 7, thereby avoiding the coupling effect occurred between the bonding electrodes 5 and the bonding connection wires 6 and the conductive layers of the transistors, further avoiding the influence of the coupling effect on the luminance of the display panel, and ensuring the uniformity of the display brightness of the display panel.

Figure 7:
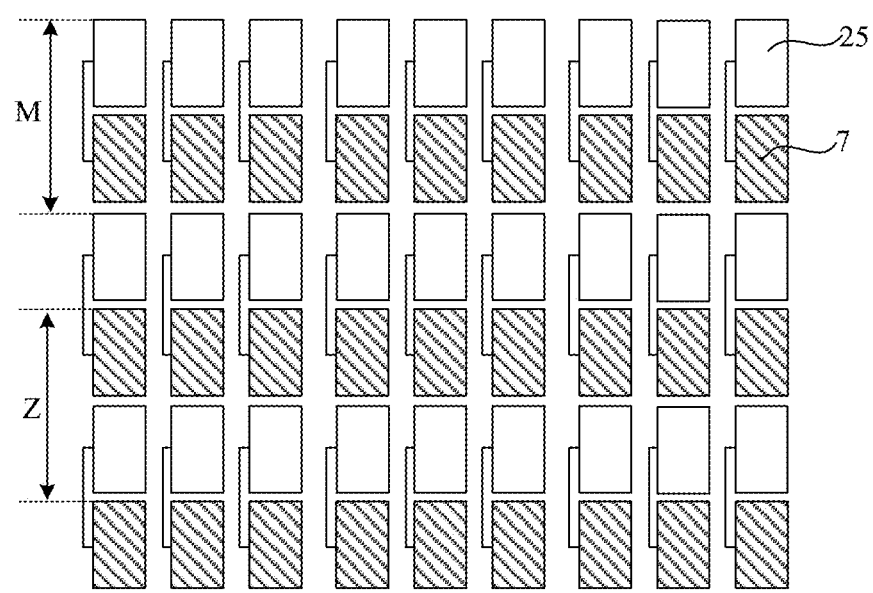
FIG. 7 is a schematic diagram of an arrangement of pixel circuits in a conventional display backplane.

As shown in FIG. 7, a display panel in the related art is shown, light emitting elements 25 are arranged at equal intervals and in an array on the display panel, and the pixel circuits 7 are coupled to the light emitting elements 25 in a one-to-one correspondence and also arranged in a uniform array. A distance M between any two adjacent rows of light emitting elements 25 is constant; a distance Z between any two adjacent rows of pixel circuits 7 is constant. The arrangement of the light emitting elements 25 on the display backplane provided by the embodiment of the present disclosure is the same as the arrangement of the light emitting elements 25 on the display backplane in the related art, that is, the light emitting elements 25 are arranged at equal intervals and in an array in the display region 3; but the arrangement of the pixel circuits 7 in the display backplane in the embodiment is different from that in the related art.

In some embodiments, the bonding electrodes 5 are disposed in the bonding region 1 in the display region 3; a length L of each bonding electrode along a Y direction is about p times the distance M between the adjacent rows of the light emitting elements 25 in the Y direction (i.e., $p=[L/M], p>1$). In order to prevent the display from being adversely affected caused by a region where the bonding electrodes 5 are located overlapping the rows of pixel circuits (pixel circuit rows), it is necessary to shift (move) the pixel circuit rows (specifically, p pixel circuit rows) overlapping with the bonding electrodes 5.

Figure 8:
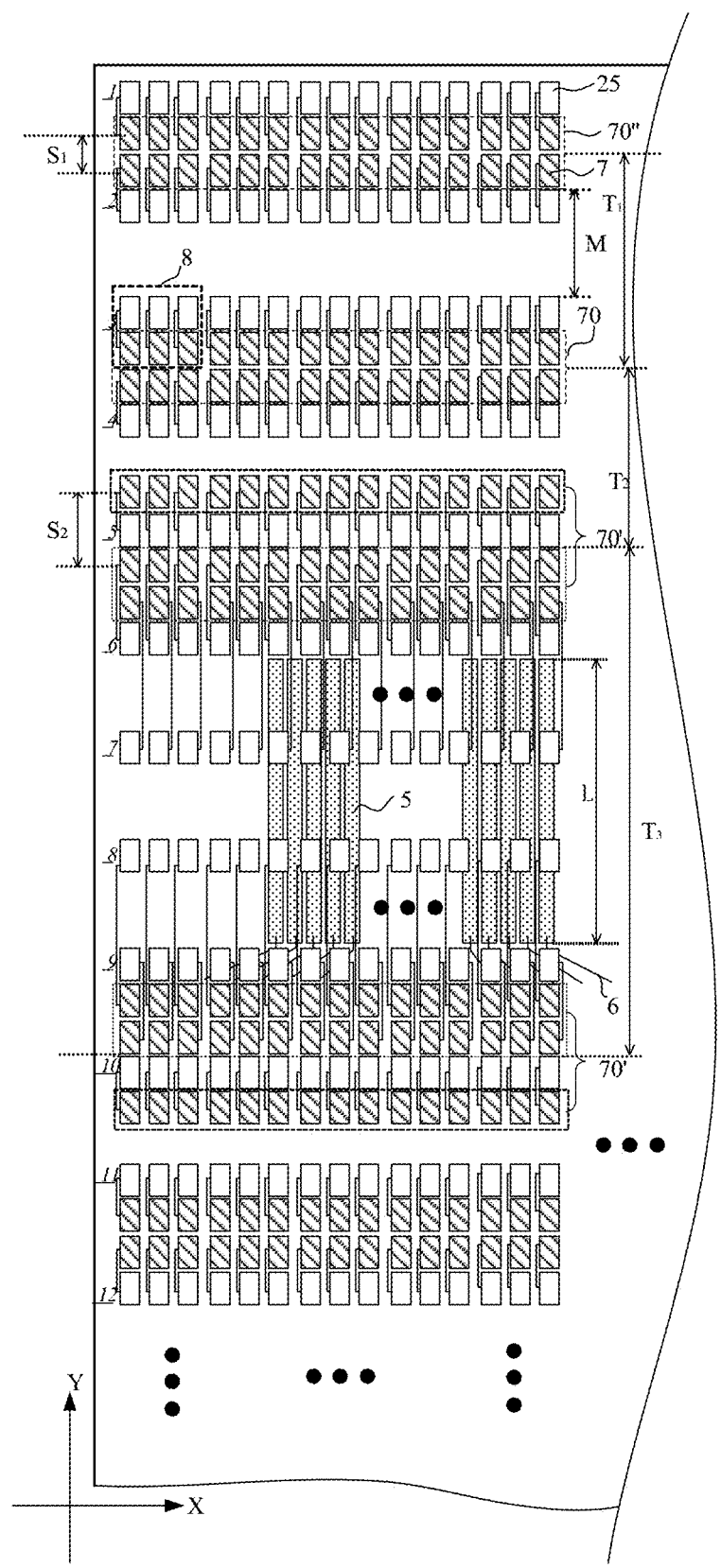
FIG. 8 is a schematic diagram of an arrangement of pixel circuits in a display backplane according to an embodiment of the present disclosure.

Specifically, as shown in FIG. 8, the length L of each bonding electrode 5 along the Y direction is about 2 times the distance M between the adjacent rows of the light emitting elements 25 in the Y direction (i.e., p=2). The bonding electrodes 5 overlap the light emitting elements located in the 7th row and the 8th row, so that two pixel circuit rows that should be disposed between the 7th row of light emitting elements and the 8th row of light emitting elements are necessarily moved and disposed above the 5th row of light emitting elements and below the 10th row of light emitting elements, respectively. The pixel circuit row above the 5th row of light emitting elements and two pixel circuit rows closest thereto form one pixel circuit group 70'; similarly, the pixel circuit row below the 10th row of light emitting elements and two pixel circuit rows closest thereto form one pixel circuit group.

In some embodiments, as shown in FIG. 8, the display backplane includes the plurality of light emitting elements 25 arranged in a uniform array, with the distance M between two adjacent rows of light emitting elements 25. The plurality of pixel circuits 7 are coupled to the light emitting elements 25 in a one-to-one correspondence; in the pixel circuit array, the adjacent n rows of pixel circuits 7 form one pixel circuit group 70/70', where n is an integer, and $2 \le n \le 5$. In one pixel circuit group 70, a distance S between any two adjacent rows of pixel circuits 7 satisfies: $0<S \le M$. That is, in the case where two rows of pixel circuits 7 are sandwiched between two adjacent rows of light emitting elements 25, a distance $S_1$ between the two rows of pixel circuits 7 is significantly smaller than the distance M between the two adjacent rows of light emitting elements 25; a distance $S_2$ between two pixel circuit rows respectively disposed close to both sides of the light emitting elements 25 in the same row is also smaller than the distance M between the two adjacent rows of light emitting elements 25. A distance T between two adjacent pixel circuit groups satisfies: $M<T \le (2 \cdot p+1) \cdot M$. That is, for a distance $T_1$ between the pixel circuit group 70 and the pixel circuit group 70'', $M<T_1 \le 2M$; for a distance $T_2$ between the pixel circuit group 70 and the pixel circuit group 70', $M<T_2 \le 2M$; for a distance $T_3$ between two adjacent pixel circuit groups 70', $M<T_3 \le 5M$.

That is, in the pixel circuit array, a distance between any two adjacent rows of n rows of pixel circuits 7 may or may not be constant; and/or, a distance between any adjacent pixel circuit groups 70 may or may not be constant. The number of rows of the pixel circuits 7 in the pixel circuit groups may or may not be constant. A pixel circuit 7 and a light emitting element 25 coupled to each other form one sub-pixel, and three adjacent sub-pixels along a row direction of the light emitting element array form one pixel 8.

In the display backplane of the embodiment of the present disclosure, all the pixel circuits 7 located in a region of the display region 3 than the bonding region 1 and the bonding wiring region 2 are arranged in the arrangement that the distance S between any two adjacent rows of pixel circuits 7 and the distance T between two adjacent pixel circuit groups 70 are as above. In this way, on one hand, compared with the pixel circuits 7 uniformly arranged in the related art, the distance S between two adjacent rows of pixel circuits 7 located in the same pixel circuit group 70 is smaller, and the distance T between two adjacent pixel circuit groups 70 is larger, so that the pixel circuits 7, which should be arranged in the bonding region 1 and the bonding wiring region 2 in a conventional pixel circuit arrangement in FIG. 7, are grouped and arranged in the region than the bonding region 1 and the bonding wiring region 2 in FIG. 8, to normally drive the light emitting elements 25 arranged in the bonding region 1 and the bonding wiring region 2; on the other hand, in the present embodiment, the arrangement of the light emitting elements 25 is kept uniform, thereby ensuring the display uniformity of the display backplane.

In addition, it is also necessary to redesign a connection relationship between the light emitting elements and the pixel circuits in related rows, to ensure that a line connecting the pixel circuit 7 and a corresponding light emitting element 25 is short, so as to avoid the influence of the overlong line connecting the pixel circuit 7 and the light emitting element 25 on the uniformity of the brightness of the light emitting element 25. In some embodiments, as shown in FIG. 8, specifically, pixel circuits in the row above light emitting elements in the 5th row are electrically coupled to the light emitting elements in the 5th row in a one-to-one correspondence; pixel circuits in the row below light emitting elements in the 5th row and close to light emitting elements in the 5th row are electrically coupled to light emitting elements in the 6th row in a one-to-one correspondence; pixel circuits in the row below light emitting elements in the 5th row and close to light emitting elements in the 6th row are electrically coupled to light emitting elements in the 7th row in a one-to-one correspondence; pixel circuits in the row below light emitting elements in the 9th row and close to light emitting elements in the 9th row are electrically coupled to light emitting elements in the 8th row in a one-to-one correspondence; pixel circuits in the row below light emitting elements in the 9th row and close to light emitting elements in the 10th row are electrically coupled to light emitting elements in the 9th row in a one-to-one correspondence; and pixel circuits in the row below light emitting elements in the 10th row are electrically coupled to light emitting elements in the 10th row in a one-to-one correspondence. For other regions in the display region, two pixel circuit rows correspondingly coupled to every two rows of light emitting elements 25 form one pixel circuit group 70; two rows of pixel circuits 7 belonging to one pixel circuit group 70 are arranged between two rows of light emitting elements 25 correspondingly coupled to the pixel circuit group 70. That is, the distance S between two rows of pixel circuits 7 belonging to one pixel circuit group 70 is smaller than the distance M between two adjacent rows of light emitting elements 25, so as to form a close arrangement; and the distance T between two adjacent pixel circuit groups 70 is greater than the distance M between two adjacent rows of light emitting elements 25.

It is understood that a distance between structures A and B described in the embodiments of the present disclosure refers to a distance between centers of the structures A and B along a certain direction; for two structures of the same shape and size, a distance between the two structures may also be a distance between the same sides of the two structures.

In some embodiments, pixel circuit rows located at an upper side and a lower side of the bonding electrode 5 along a row direction of the light emitting element array are symmetrically arranged about a center line of the bonding electrode 5 extending along the X direction as a symmetry axis.

In some embodiments, when even-numbered rows of pixel circuits need to be moved, there is no case where one row of pixel circuits is provided separately.

Figure 9:
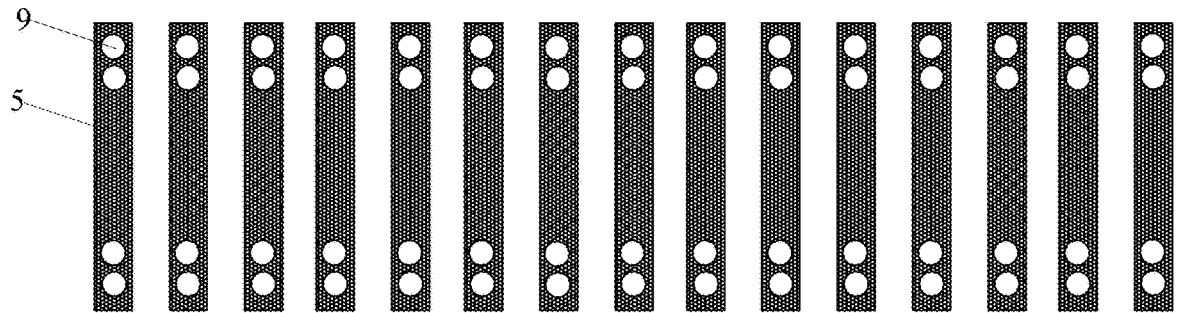
FIG. 9 is a schematic diagram illustrating a positional relationship between first vias formed in a base and a bonding electrode according to an embodiment of the present disclosure.

In some embodiments, as shown in FIG. 9, an orthographic projection of the first via 9 on the base is located within the orthographic projection of an end of a corresponding bonding electrode 5 on the base. The first via 9 is formed in the base and used for connecting a corresponding bonding electrode 5 to a corresponding bonding connection wire 6. The orthographic projection of the first via 9 on the base is located within the orthographic projection of an end of a corresponding bonding electrode 5 on the base, which, on one hand, may reduce a wiring length of the bonding connection wire 6, so that the resistance of the bonding connection wire 6 is reduced, and attenuation of a transmission signal on the bonding connection wire 6 is reduced; on the other hand, may reduce the distribution range of the bonding connection wires 6, which prevents the bonding connection wires 6 from overlapping the region where the transistors in the pixel circuits are located, and ensures the uniformity of the display brightness.

In some embodiments, a plurality of first vias 9 are disposed at two ends of the bonding electrode 5, respectively. The plurality of first vias 9 arranged at two ends of the same bonding electrode 5 are coupled to the same bonding connection wire 6. The arrangement of the first vias 9 may ensure a more reliable connection between the bonding connection wire 6 and the corresponding bonding electrode 5, and prevent the bonding electrode 5 from being disconnected from the bonding connection wire 6 under the extrusion action when bonding to a peripheral circuit.

In some embodiments, N first vias 9 are correspondingly disposed in the same bonding electrode 5, where N is an even number. N/2 first vias 9 are correspondingly disposed at one end of the bonding electrode 5; and the other N/2 first vias 9 are correspondingly disposed at the other end of the bonding electrode 5. The N first vias 9 are sequentially arranged along a length direction of the bonding electrode 5. If N is 4, two first vias are disposed at one end of the bonding electrode 5, and the other two first vias are disposed at the other end of the bonding electrode 5.

In some embodiments, $2 \leq N \leq 8$. The length of the bonding electrode 5 is in a range of 0.5 to 1.5 mm. The aperture of the first via 9 is in a range of 20 nm to 50 nm.

In some embodiments, the pixel circuits 7 are located on a side of the bonding connection wires 6 away from the base; and a first insulating layer is further disposed between the pixel circuits 7 and the bonding connection wires 6; second vias are formed in the first insulating layer; and the pixel circuits 7 are coupled to the bonding connection wires 6 through the second vias. The pixel circuit includes a plurality of devices, such as a transistor, a capacitor, a resistor; and the transistor includes a plurality of layers, such as an active layer, a gate electrode, a gate insulating layer, a source electrode and a drain electrode. The first insulating layer may include a plurality of insulating sub-layers, and is not limited to only one insulating layer; the second vias formed in the first insulating layer may include a plurality of sub-vias formed in different insulating sub-layers, respectively. The plurality of sub-vias may be formed as stacked vias aligned with each other, or may also be formed as not aligned with each other, as long as it is ensured that each conductive layer in the pixel circuit 7 may be coupled to the corresponding bonding electrode 5 through the corresponding bonding connection wire 6.

Figure 10:
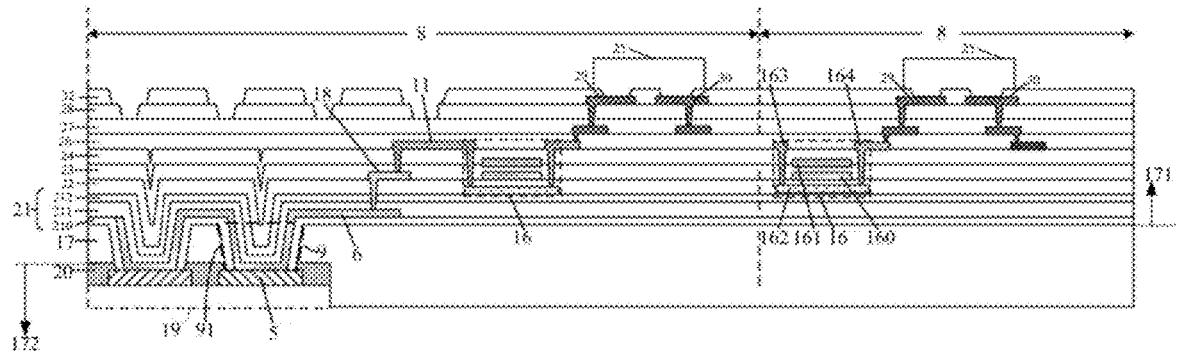
FIG. 10 is a schematic diagram illustrating an overlapping of a bonding connection wire and an active layer of a transistor in a display backplane according to an embodiment of the present disclosure.

In this embodiment, as shown in FIG. 10, the plurality of transistors 16 in the pixel circuit are located on the first side 171 of the base 17 and are located in the plurality of sub-pixels 8, respectively. In some embodiments, a respective one of the plurality of transistors 16 is selected from a group consisting of a top-gate type transistor and a bottom-gate type transistor. For example, a respective one of the plurality of transistors 16 includes a first gate electrode 160, a second gate electrode 161, an active layer 162, a source electrode 163 electrically coupled to the active layer 162, and a drain electrode 164 electrically coupled to the active layer 162.

In some embodiments, a surface of the bonding electrode 5 is exposed from the second side 172 of the base 17, and the bonding electrode 5 may be coupled to the corresponding pixel circuit on the second side 172 of the base 17. A respective one of the plurality of sub-pixels 8 includes a bonding connection wire 6 that electrically connects a corresponding one of the plurality of transistors 16 to the bonding electrode 5.

In some embodiments, the bonding connection wire 6 is electrically coupled to a signal line 11. In some embodiments, the signal line 11 is selected from a group consisting of a gate line, a data line, a touch signal line, a clock signal line, a high power voltage line, a low power voltage line, a common signal line, and a floating signal line. For example, the bonding connection wire 6 is electrically coupled to the data line, thereby connecting a respective one of the plurality of transistors 16 to the corresponding bonding electrode 5. In some embodiments, the signal line 11 and the bonding connection wire 6 are formed in different layers.

Referring to FIG. 10, a respective one of the plurality of sub-pixels 8 includes a relay wire 18 connecting the bonding connection wire 6 to the signal line 11. For example, the bonding connection wire 6 connects the bonding electrode 5 to the relay wire 18, which in turn connects the bonding connection wire 6 to the signal line 11 (e.g., a data line), so that the bonding connection wire 6 electrically couples a respective one of the plurality of transistors 16 to the bonding electrode 5. In some embodiments, the signal line 11 and the relay wire 18 are formed in different layers. In some embodiments, the relay wire 18 and the bonding connection wire 6 are formed in different layers.

In some embodiments, the bonding connection wire 6 is electrically coupled to a source electrode of a respective one of the plurality of transistors 16. In some embodiments, the relay wire 18 couples the bonding connection wire 6 to the source electrode of a respective one of the plurality of transistors 16.

Referring to FIG. 10, a respective one of the plurality of sub-pixels 8 includes first vias 9 extending through the base 17. In some embodiments, the first via 9 exposes a portion of a surface of the bonding electrode 5 close to the bonding connection wire 6. In some embodiments, the bonding connection wire 6 extend from the first side 171 to the second side 172 of the base 17 via the first vias 9, to be coupled to the bonding electrode 5.

In some embodiments, the display backplane further includes a recess 19 in a region corresponding to the bonding electrode 5 and on the second side 172 of the base 17, thereby exposing a surface of the bonding electrode 5 away from the bonding connection wire 6. For example, the recess 19 does not expose any surface of the bonding connection wire 6.

In some embodiments, the display backplane further includes an insulating layer 20 located on the second side 172 of the base 17. The bonding electrode 5 is located on a side of the insulating layer 20 away from the base 17. In some embodiments, the first via 9 extends through the base 17 and the insulating layer 20 to expose the surface of the bonding electrode 5 close to the bonding connection wire 6.

In some embodiments, the display backplane further includes a plurality of additional insulating layers 21, each extending partially into the first vias 9. In some embodiments, each of the plurality of additional insulating layers 21 extends across the display region. In some embodiments, the plurality of additional insulating layers 21 includes a passivation layer 210 extending across the display region. For example, the passivation layer 210 extends across a region corresponding to the bonding electrodes 5. In some embodiments, the passivation layer 210 is on the first side 171 of the base 17. In some embodiments, the passivation layer 210 at least partially covers a side 91 of the first via 9. In some embodiments, the plurality of additional insulating layers 21 includes a blocking layer 211 extending across the display region. The blocking layer 211 extends across a region corresponding to the bonding electrodes 5. The blocking layer 211 is located on a side of the passivation layer 210 and the bonding connection wires 6 away from the base 17.

In some embodiments, the plurality of additional insulating layers 21 further includes a buffer layer 212 extending across the display region. The buffer layer 212 is located on a side of the blocking layer 211 away from the base 17. In some embodiments, a respective one of the plurality of transistors 16 includes an active layer 162 on a side of the buffer layer 212 away from the base 17.

In some embodiments, the display backplane further includes a first gate insulating layer 22 extending across the display region. The first gate insulating layer 22 is located on the side of the buffer layer 212 away from the blocking layer 211. In some embodiments, a respective one of the plurality of transistors 16 includes a first gate electrode 160 on a side of the first gate insulating layer 22 away from the active layer 162.

In some embodiments, the display backplane further includes a second gate insulating layer 23 extending across the display region. The second gate insulating layer 23 is located on a side of the first gate insulating layer 22 away from the buffer layer 212. In some embodiments, a respective one of the plurality of transistors 16 includes a second gate electrode 161 located on a side of the second gate insulating layer 23 away from the first gate electrode 160.

In some embodiments, the display backplane further includes an interlayer dielectric layer 24 extending across the display region. The interlayer dielectric layer 24 is located on a side of the second gate insulating layer 23 away from the first gate insulating layer 22. In some embodiments, the signal line 11 is located on a side of the interlayer dielectric layer 24 away from the base 17.

In some embodiments, the source electrode 163 of the respective one of the plurality of transistors 16 extends through the first gate insulating layer 22, the second gate insulating layer 23, and the interlayer dielectric layer 24 and couples the active layer 162 to the signal line 11. In some embodiments, the drain electrode 164 of the respective one of the plurality of transistors 16 extends through the first gate insulating layer 22, the second gate insulating layer 23, and the interlayer dielectric layer 24 and couples the active layer 162 to a respective one of the plurality of light emitting elements 25.

In some embodiments, the source electrode 163 of the respective one of the plurality of transistors 16 extends through the first gate insulating layer 22, the second gate insulating layer 23, and the interlayer dielectric layer 24 to be coupled to the relay wire 18. In some embodiments, the source electrode 163 of the respective one of the plurality of transistors 16 extends through the first gate insulating layer 22, the second gate insulating layer 23, and the interlayer dielectric layer 24 to be coupled to the bonding connection wire 6.

In some embodiments, the display backplane further includes a first planarization layer 26 located on a side of the interlayer dielectric layer 24 away from the second gate insulating layer 23. In some embodiments, the first planarization layer 26 extends across the display region.

In some embodiments, the display backplane further includes a second planarization layer 27 on a side of the first planarization layer 26 away from the interlayer dielectric layer 24. The second planarization layer 27 extends across the display region.

In some embodiments, the display backplane further includes: a second passivation layer 28 on a side of the second planarization layer 27 away from the first planarization layer 26; and first contact pads 29 and second contact pads 30 on a side of the second passivation layer 28 away from the second planarization layer 27. In some embodiments, the first contact pad 29 is electrically coupled to the drain electrode 164 of a respective one of the plurality of transistors 16. In some embodiments, the second contact pad 30 is electrically coupled to the common signal line. In some embodiments, a third passivation layer 32 is further provided on a side of the second passivation layer 28 away from the base 17, and is primarily used to insulate and isolate the first contact pads 29 from the second contact pads 30 and to expose surfaces of the first contact pads 29 and the second contact pads 30 that are coupled to corresponding electrodes of the light emitting elements.

For example, a respective one of the plurality of light emitting elements 25 is a micro light emitting diode (Micro LED) having a cathode and an anode. The first contact pad 29 and the second contact pad 30 are electrically coupled to the cathode and the anode of the micro light emitting diode, respectively, through vias formed in the third passivation layer 32.

In some embodiments, as shown in FIG. 6, the display backplane further includes shift registers 4 disposed on a side of the bonding connection wires 6 away from the base, and an orthographic projection of the shift register 4 on the base is at least partially located within an orthographic projection of the bonding electrode 5, which provides a signal to the shift register 4, on the base; one end of the shift register 4 is coupled to the bonding electrode 5 through the bonding connection wire 6, and the other end of the shift register 4 is coupled to the pixel circuit 7.

In some embodiments, the shift registers 4 and the pixel circuits 7 are disposed in the same layer; the shift register 4 is located in a region between two adjacent columns of the pixel circuits 7; the first insulating layer further extends between the shift registers 4 and the bonding connection wires 6; third vias are formed in the first insulating layer; the shift registers 4 are is coupled to the bonding connection wire 6 through the third via, and then, are coupled to the bonding electrodes 5 through the bonding connection wires 6.

Signals such as a trigger signal, a clock signal, a power signal and the like are required in the operation of the shift registers 4; the signals are generated by a peripheral circuit, and then the signals are input to the shift registers 4 through the bonding electrodes 5 and the bonding connection wires 6. The first insulating layer may include a plurality of insulating sub-layers, and is not limited to only one insulating layer; the third via formed in the first insulating layer may include a plurality of sub-vias formed in different insulating sub-layers respectively. The plurality of sub-vias may be formed as stacked vias aligned with each other, or may also be formed as not aligned with each other, as long as it is ensured that the signal line layer in the shift register 4 may be coupled to the corresponding bonding electrode 5 through the corresponding bonding connection wire 6.

In the related art, the shift registers are disposed at the periphery of the display backplane, which results in a large wiring region and a long length of the bonding connection wires 6 coupled to the bonding electrodes and the shift registers, which not only increases the loss of electrical signals, but also increases an overlapping area of the bonding connection wires 6 with the conductive layers of the transistors in the pixel circuits 7, so that the display panel adopting the display backplane have poor brightness uniformity. In the present embodiment, the shift register 4 are disposed at the position described above. In this way, the wiring length of the bonding connection wires 6 may be reduced, so as to reduce the resistance of the bonding connection wires 6, and reduce the loss of the transmission signals on the bonding connection wires 6; on the other hand, the distribution range of the bonding connection wires 6 may be reduced, which avoids the overlapping of the bonding connection wires 6 and the conductive layers of the transistors in the pixel circuits 7, and ensures the uniformity of the display brightness of the display panel adopting the display backplane.

In some embodiments, the shift register 4 includes a plurality of stages of shift registers cascaded with each other and arranged along a column direction Y in which the pixel circuits 7 are arranged. The shift register 4 includes a plurality of transistors; the pixel circuit 7 includes a plurality of transistors; and layers (e.g., a gate electrode, a gate insulating layer, an active layer, a source electrode, and a drain electrode) of the transistors in the shift register 4 is disposed in the same layer as corresponding layers (e.g., a gate electrode, a gate insulating layer, an active layer, a source electrode, and a drain electrode) of the transistors in the pixel circuit 7, respectively. The pixel circuits 7 in the same row are coupled to a same scan signal line, and each stage of the shift register 4 is coupled to scan signal lines.

In some embodiments, a plurality of groups of shift registers 4 are disposed in the display backplane, and are sequentially arranged along the row direction X in which the pixel circuits 7 are arranged. In this way, each group of shift registers 4 may be conveniently and sequentially coupled to the corresponding bonding electrodes 5 for providing signals for the group of shift registers, respectively, so that the peripheral circuit may conveniently provide signals for the group of shift registers through the bonding electrodes 5.

In some embodiments, the pixel circuits in the same row are coupled to a same scan signal line; and two groups of shift registers are disposed in the display backplane, and are respectively coupled to two ends of each scan signal line and synchronously output signals, so as to implement bilateral driving of each row of the pixel circuits.

In some embodiments, the pixel circuits in the same row are coupled to a same scan signal line, and two groups of shift registers (i.e., working shift registers and standby shift registers) are arranged in the display backplane; the working shift registers are coupled to the scan signal lines; the standby shift registers correspond to the scan signal lines, and are coupled to the scan signal lines and become enabled only when the working shift registers have faults.

In some embodiments, the pixel circuits in the same row are coupled to a same scan signal line and a same light emitting enabling signal line; and two groups of shift registers are arranged in the display backplane; one group of shift registers is coupled to a row scan signal line; and the other group of shift registers is coupled to the light emitting enabling signal line.

Figure 11:
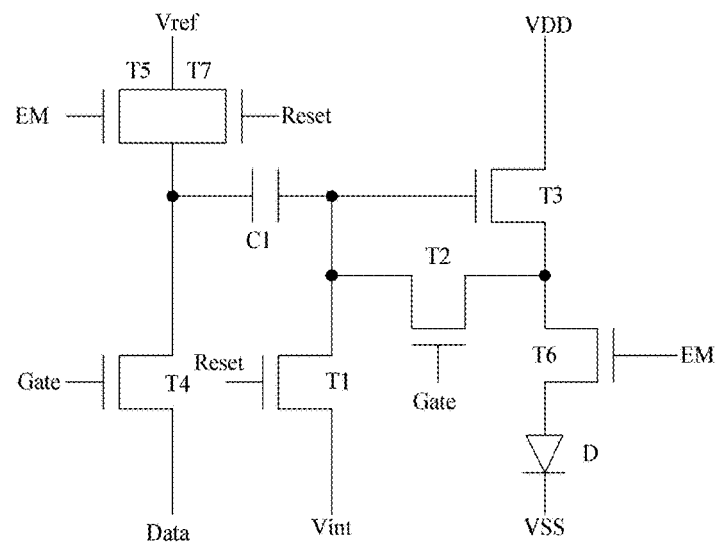
FIG. 11 is a schematic diagram of a structure of a pixel circuit in an embodiment of the present disclosure.

In some embodiments, as shown in FIG. 11, the pixel circuit includes: a first transistor T1, a second transistor T2, a third transistor T3, a fourth transistor T4, a fifth transistor T5, a sixth transistor T6, a seventh transistor T7, a first storage capacitor C1, and a light emitting element D. A first electrode of the first transistor T1 is coupled to an initial voltage signal terminal Vint. A second electrode of the first transistor T1 is coupled to a second terminal of the first storage capacitor C1, a first electrode of the second transistor T2, and a control electrode of the third transistor T3. A control electrode of the first transistor T1 is coupled to a reset signal terminal Reset. A second electrode of the second transistor T2 is coupled to a second electrode of the third transistor T3 and a first electrode of the sixth transistor T6. A control electrode of the second transistor T2 is coupled to a gate scan signal line Gate. A first electrode of the third transistor T3 is coupled to a first power voltage terminal VDD. A first electrode of the fourth transistor T4 is coupled to a data line Data. A second electrode of the fourth transistor T4 is coupled to a second electrode of the fifth transistor T5, a second electrode of the seventh transistor T7 and a first terminal of the first storage capacitor C1. A control electrode of the fourth transistor T4 is coupled to the gate scan signal line Gate. A first electrode of the fifth transistor T5 is coupled to a reference voltage signal terminal Vref. A control electrode of the fifth transistor T5 is coupled to the light emitting enabling signal line EM. A second electrode of the sixth transistor T6 is coupled to a first electrode of the light emitting element D. A control electrode of the sixth transistor T6 is coupled to the light emitting enabling signal line EM. A first electrode of the seventh transistor T7 is coupled to the reference voltage signal terminal Vref. A control electrode of the seventh transistor T7 is coupled to the reset signal terminal Reset. A second electrode of the light emitting element is coupled to a second power voltage terminal VSS.

Figure 12:
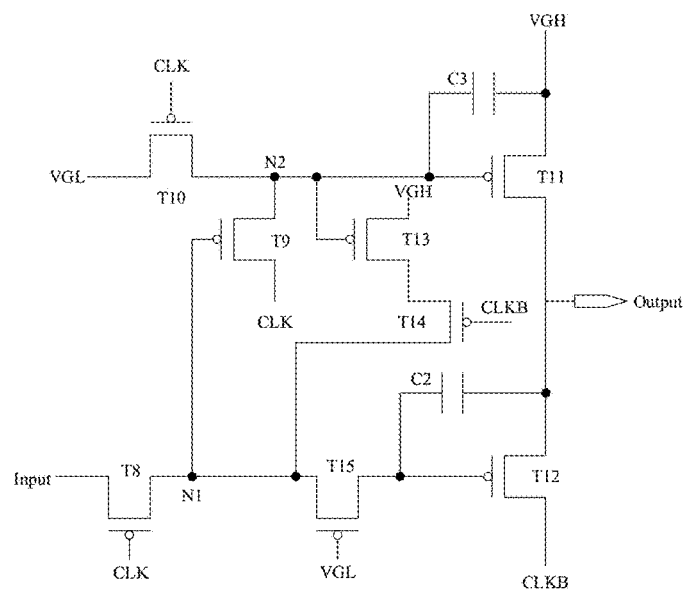
FIG. 12 is a schematic diagram of a structure of a shift register in an embodiment of the present disclosure.

In some embodiments, a shift register circuit includes a plurality of shift registers 4 connected in cascade, and a structure of each shift register 4 is shown in FIG. 12. The shift register 4 includes: an eighth transistor T8, a ninth transistor T9, a tenth transistor T10, an eleventh transistor T11, a twelfth transistor T12, a thirteenth transistor T13, a fourteenth transistor T14, a second storage capacitor C2, and a third storage capacitor C3. A first electrode of the eighth transistor T8 is coupled to a signal input terminal Input. A second electrode of the eighth transistor T8 is coupled to a node N1. A control electrode of the eighth transistor T8 is coupled to a first clock signal terminal CLK. A first electrode of the ninth transistor T9 is coupled to the first clock signal terminal CLK. A second electrode of the ninth transistor T9 is coupled to a node N2. A control electrode of the ninth transistor T9 is coupled to the node N1. A first electrode of the tenth transistor T10 is coupled to a low level signal terminal VGL. A second electrode of the tenth transistor T10 is coupled to the node N2. A control electrode of the tenth transistor T10 is coupled to the first clock signal terminal CLK. A first electrode of the eleventh transistor T11 is coupled to a high level signal terminal VGH and a second terminal of the third storage capacitor C3. A second electrode of the eleventh transistor T11 is coupled to a signal output terminal Output. A control electrode of the eleventh transistor T11 is coupled to the node N2. A first terminal of the third storage capacitor C3 is coupled to the node N2. A first electrode of the twelfth transistor T12 is coupled to a second clock signal terminal CLKB. A second electrode of the twelfth transistor T12 is coupled to a second terminal of the second storage capacitor C2 and the signal output terminal Output. A control electrode of the twelfth transistor T12 is coupled to a first terminal of the second storage capacitor C2. A first electrode of the thirteenth transistor T13 is coupled to the high level signal terminal VGH. A second electrode of the thirteenth transistor T13 is coupled to a first electrode of the fourteenth transistor T14. A control electrode of the thirteenth transistor T13 is coupled to the node N2. A second electrode of the fourteenth transistor T14 is coupled to the node N1. A control electrode of the fourteenth transistor T14 is coupled to the second clock signal terminal CLKB. A first electrode of a fifteenth transistor T15 is coupled to the node N1. A second electrode of the fifteenth transistor T15 is coupled to the first terminal of the second storage capacitor C2. A control electrode of the fifteenth transistor T15 is coupled to the low level signal terminal VGL.

In some embodiments, as shown in FIG. 6, the display backplane further includes a data selection circuit 10; an orthographic projection of the data selection circuit 10 on the base partially overlaps orthographic projections of the bonding connection wires 6 on the base; one end of the data selection circuit 10 is coupled to the bonding electrodes 5 through the bonding connection wires 6; and the other end of the data selection circuit 10 is coupled to the data lines 15; the data line 15 is configured to couple the pixel circuit 7 and the data selection circuit 10. The data selection circuit 10 is arranged in a region of the display region 3 close to the bonding region 1; on one hand, the wiring length of the bonding connection wires 6 may be greatly shortened, so that the resistance of the bonding connection wires 6 is reduced, and the loss of transmission signals on the bonding connection wires 6 is reduced; on the other hand, the distribution range of the bonding connection wires 6 may be greatly reduced, which avoids the overlapping of the bonding connection wires 6 with the conductive layers of the transistors in the pixel circuits 7, and ensures the uniformity of the display brightness.

In some embodiments, the data selection circuit 10 is located on a side of the bonding connection wires 6 away from the base; the data selection circuit 10 and the pixel circuits 7 are arranged in a same layer; and the data selection circuit 10, the pixel circuits 7 and the shift registers 4 are deviated with each other; the first insulating layer further extends between the data selection circuit 10 and the bonding connection wires 6; fourth vias are formed in the first insulating layer; and the data selection circuit 10 is coupled to the bonding connection wires 6 through the fourth vias, to be coupled to the bonding electrodes 5 through the bonding connection wires 6. The first insulating layer may include a plurality of insulating sub-layers, and is not limited to only one insulating layer; the fourth vias formed in the first insulating layer may include a plurality of sub-vias formed in different insulating sub-layers, respectively. The plurality of sub-vias may be formed as stacked vias aligned with each other, or may also be formed as not aligned with each other, as long as it is ensured that the data selection circuit 10 may be coupled to the corresponding bonding electrode 5 through the corresponding bonding connection wire 6.

In some embodiments, the plurality of bonding electrodes 5 are arranged along the row direction X in which the pixel circuits 7 are arranged; and a length direction of the of the plurality of bonding electrodes 5 is parallel to the column direction Y in which the pixel circuits 7 are arranged; a shape of the data selection circuit 10 includes a long strip shape, and a length direction of the data selection circuit 10 is parallel to the row direction X in which the pixel circuits 7 are arranged. Since the arrangement direction of the data lines 15 is along the row direction X in which the pixel circuits 7 are arranged, the length direction of the data selection circuit 10 is parallel to the row direction X in which the pixel circuits 7 are arranged, so that selection output terminals of the data selection circuit 10 are correspondingly coupled to the data lines 15, respectively, and a connection line between the selection output terminal and a corresponding data line 15 is not long.

In some embodiments, the data selection circuit 10 includes a plurality of data selection circuits 10 parallel to each other and arranged in sequence along the column direction Y in which the pixel circuits 7 are arranged. The plurality of data selection circuits 10 are used for selecting different data lines 15 to turn on/off the data lines, respectively. For a display panel with a relatively high resolution, the number of data lines 15 is great. The plurality of data selection circuits 10 are provided, which may avoid the excessive number of bonding electrodes 5 coupled to the data lines 15 and the excessive occupied space, and may ensure that the selecting of the data lines 15 may be realized through the small number of bonding electrodes 5.

Figure 13:
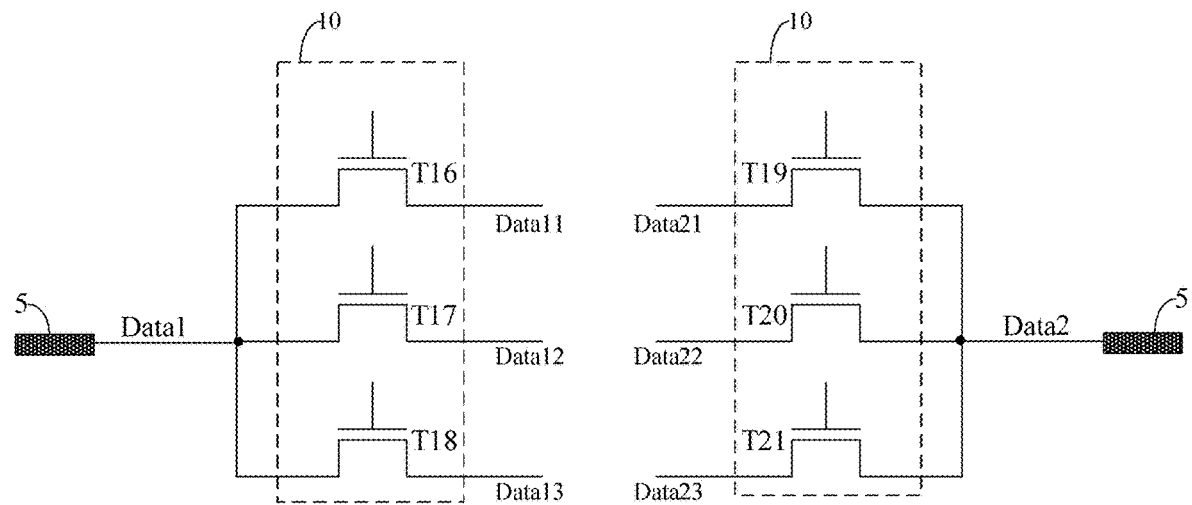
FIG. 13 is a schematic diagram illustrating two data selection circuits select the on/off of connection to data lines in the embodiment of the present disclosure.

In some embodiments, as shown in FIG. 13, two data selection circuits 10 are provided; one data selection circuit includes a sixteenth transistor T16, a seventeenth transistor T17, and an eighteenth transistor T18. A first electrode of the sixteenth transistor T16, a first electrode of the seventeenth transistor T17, and a first electrode of the eighteenth transistor T18 are coupled together, and coupled to a source driver (not shown) through a data voltage incoming line Data1 coupled to one bonding electrode 5. A second electrode of the sixteenth transistor T16 is coupled to a first data line Data11; a second electrode of the seventeenth transistor T17 is coupled to a second data line Data12; a second electrode of the eighteenth transistor T18 is coupled to a third data line Data13; and control electrodes of the sixteenth transistor T16, the seventeenth transistor T17 and the eighteenth transistor T18 are coupled to different output terminals of the timing controller (not shown), respectively. The other data selection circuit 10 includes a nineteenth transistor T19, a twentieth transistor T20, and a twenty-first transistor T21. A first electrode of the nineteenth transistor T19, a first electrode of the twentieth transistor T20, and a first electrode of the twenty-first transistor T21 are coupled together, and coupled to a source driver (not shown) through a data voltage incoming line Data2 coupled to the other bonding electrode 5. A second electrode of the nineteenth transistor T19 is coupled to a fourth data line Data21; a second electrode of the twentieth transistor T20 is coupled to a fifth data line Data22; a second electrode of the twenty-first transistor T21 is coupled to a sixth data line Data23; and control electrodes of the nineteenth transistor T19, the twentieth transistor T20 and the twenty-first transistor T21 are coupled to different output terminals of the timing controller (not shown), respectively.

The transistors used in some examples described above may be thin film transistors or field effect transistors or other devices having the same characteristic, and since the source electrode and the drain electrode of the transistor are symmetrical, there is no difference between the source electrode and drain electrode.

In the above some examples, in order to distinguish the source and drain electrodes of the transistor, one of the source and drain electrodes is called a first electrode, the other electrode is called a second electrode, and the gate electrode is called a control electrode. The transistors may be classified into N-type transistors and P-type transistors according to their characteristics. When a P-type transistor is adopted, the first electrode is the source electrode of the P-type transistor, the second electrode is the drain electrode of the P-type transistor; and when a low level signal is input to the gate electrode, the source electrode is communicated with the drain electrode. When an N-type transistor is adopted, the first electrode is the source electrode of the N-type transistor, the second electrode is the drain electrode of the N-type transistor; and when a high level signal is input to the gate electrode, the source electrode is communicated with the drain electrode.

In addition, as an example, each transistor in the above pixel circuit is an N-type transistor. The implementation of a P-type transistor is conceivable by one of ordinary skill in the art without creative efforts, and therefore, is within the protection scope of the present disclosure.

In some embodiments, the sub-pixel includes a pixel circuit 7 and a light emitting element; the plurality of pixel circuits 7 are coupled to the plurality of light emitting elements in a one-to-one correspondence; one pixel circuit 7 may drive one light emitting element to emit light; and the pixel circuit 7 at least includes a capacitor and a thin film transistor electrically coupled to each other.

Based on the above structure of the display backplane, the embodiment of the present disclosure further provides a method for manufacturing a display backplane, including sequentially preparing a plurality of bonding electrodes, a base, and first vias in the base, a plurality of bonding connection wires, and a plurality of pixel circuits on a substrate; the plurality of bonding electrodes are coupled to the plurality of bonding connection wires in a one-to-one correspondence; the plurality of bonding electrodes and the plurality of bonding connection wires are positioned on two opposite surfaces of the base, respectively, and the plurality of pixel circuits and the plurality of bonding connection wires are positioned on the same side of the base; one end of each of the plurality of bonding connection wires is coupled to the bonding electrode through the first via; the other end of each of at least some of the plurality of bonding connection wires is coupled to the pixel circuit; an orthographic projection of at least one of the plurality of bonding electrodes and the plurality of bonding connection wires on the base is not coincident with an orthographic projection of the pixel circuits on the base.

Various suitable materials may be used to manufacture the base and various layers of the display backplane as shown in FIG. 10. Examples of materials suitable for manufacturing the base include, but are not limited to, polyimide and polyester, and the like.

Various suitable materials may be used to manufacture the bonding electrode. Examples of materials suitable for manufacturing the bonding electrode include, but are not limited to, titanium (Ti), aluminum (Al), copper (Cu), molybdenum (Mo), or an alloy formed by any two of these metals.

Various suitable insulating materials and various suitable manufacturing process may be used to manufacture the insulating layer. For example, the insulating material may be deposited on the base through a plasma enhanced chemical vapor deposition (PECVD) process. Examples of suitable insulating materials include, but are not limited to, polyimide, silicon oxide ($SiO_y$), silicon nitride ($SiN_y$, e.g., $Si_3N_4$), and silicon oxynitride ($SiO_xN_y$). The insulating layer is made of, for example, silicon oxide ($SiO_2$), and is configured to prevent the bonding electrodes from being exposed to air and moisture. The insulating layer made of silicon oxide ($SiO_2$) may increase adhesion between the insulating layer and the base.

Various suitable insulating materials and various suitable manufacturing process may be used to manufacture the passivation layer. For example, the material may be deposited on the base through a plasma enhanced chemical vapor deposition (PECVD) process. Examples of suitable materials include, but are not limited to, polyimide, silicon oxide ($SiO_y$), silicon nitride ($SiN_y$, e.g., $Si_3N_4$), and silicon oxynitride ($SiO_xN_y$).

Various suitable materials may be used to manufacture the bonding connection wires. Examples of materials suitable for manufacturing the bonding connection wires include, but are not limited to, copper (Cu), aluminum (Al), and combination of copper and aluminum.

Various suitable conductive electrode materials and various suitable manufacturing process may be used to manufacture the source and drain electrodes. In some embodiments, the conductive electrode material includes a metallic material. Examples of suitable metallic materials include, but are not limited to, molybdenum, gold, and aluminum.

Various suitable insulating materials and various suitable manufacturing process may be used to manufacture the buffer layer. For example, the insulating material may be deposited on the base through a plasma enhanced chemical vapor deposition (PECVD) process. Examples of materials suitable for manufacturing the buffer layer include, but are not limited to, silicon oxide ($SiO_x$), silicon nitride ($SiN_x$), or a combination thereof. In some embodiments, the buffer layer may have a single-layer structure or a stacked structure including two or more sub-layers (e.g., a stacked structure including a silicon oxide sub-layer and a silicon nitride sub-layer). In some embodiments, the buffer layer has a thickness in a range from about 100 nm to about 400 nm. For example, the buffer layer may include a silicon oxide sub-layer having a thickness in a range of about 50 nm to about 100 nm and a silicon nitride sub-layer having a thickness in a range of about 100 nm to about 300 nm.

Various suitable dielectric materials and various suitable manufacturing process may be used to manufacture the interlayer dielectric layer. For example, the dielectric material may be deposited on the base through a plasma enhanced chemical vapor deposition process. Examples of materials suitable for manufacturing the interlayer dielectric layer include, but are not limited to, silicon oxide ($SiO_y$), silicon nitride ($SiN_y$, e.g., $Si_3N_4$), and silicon oxynitride ($SiO_xN_y$).

Various suitable materials may be used to manufacture the first contact pad and the second contact pad. In some embodiments, a respective one of the first and second contact pads includes two sub-layers; a first sub-layer of the two sub-layers is formed using a metal including, but not limited to, molybdenum (Mo), titanium (Ti), and a combination of molybdenum (Mo) and titanium (Ti); and a second sub-layer of the two sub-layers is formed using copper (Cu). In some embodiments, the second sub-layer is formed on a side of the first sub-layer away from the base.

In some embodiments, the method for manufacturing a display backplane further includes a step of peeling off the substrate. The substrate is made of glass or quartz. In order to achieve the flexibility of the display backplane, the hard substrate may be peeled off after all layers of the display backplane are formed; and the reserved base is made of a flexible material, so that flexible deformation of the display backplane can be achieved.

Figure 14:
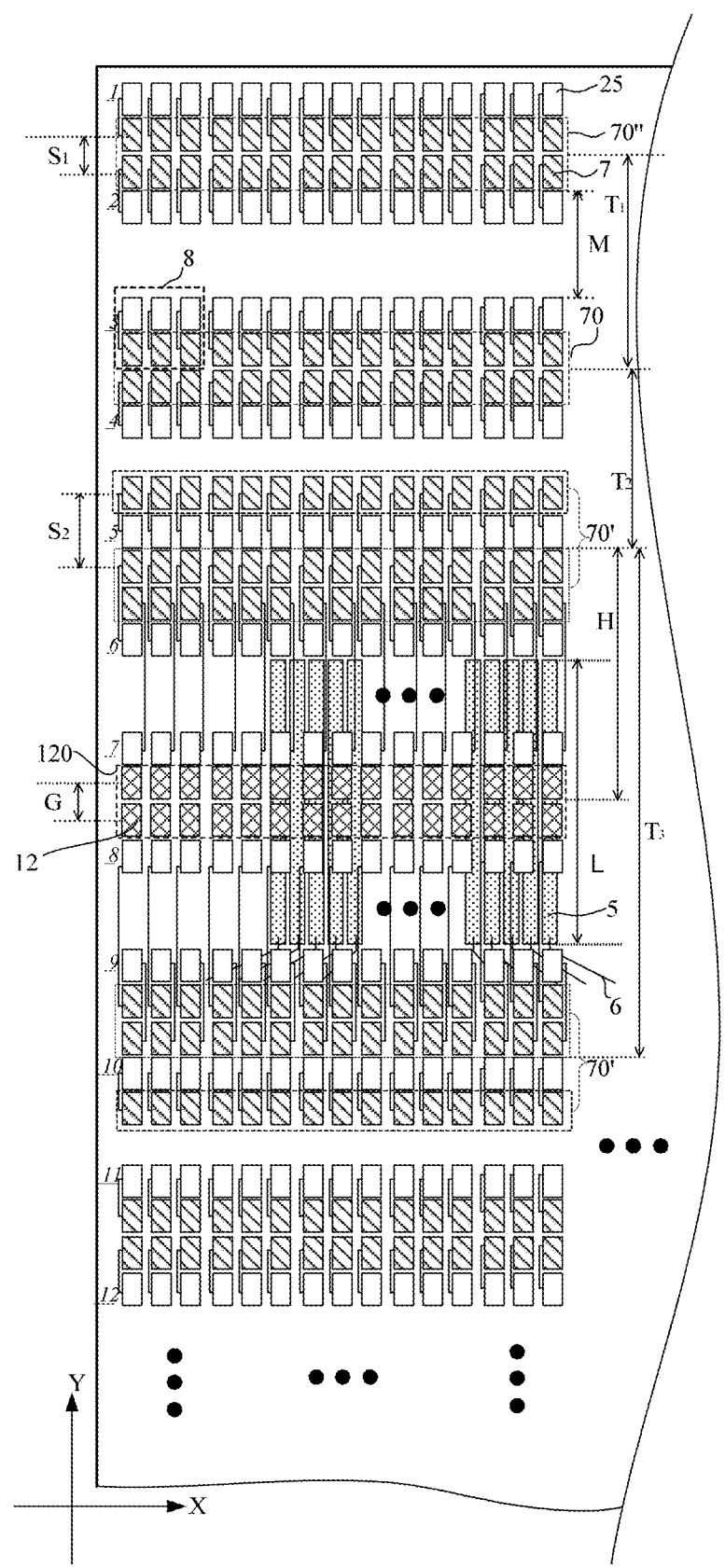
FIG. 14 is a schematic top view of an architecture of signal lines of a display backplane according to another embodiment of the present disclosure.

The embodiment of the present disclosure further provides a display backplane. As shown in FIG. 14, on the basis of the display backplane provided in the above embodiments, the display backplane further includes a plurality of dummy circuits 12 disposed on the base; and the orthographic projection of at least one of the plurality of bonding electrodes 5 and the plurality of bonding connection wires 6 on the base partially overlaps an orthographic projection of at least one of the plurality of dummy circuits 12 on the base. The dummy circuits 12 and the bonding connection wires 6 are located on the same side of the base; the dummy circuits 12 are located in the bonding region and the bonding wiring region; and the dummy circuit 12 has the same circuit structure as the pixel circuit 7. However, the dummy circuits 12 are not coupled to other elements in the display backplane, for example, not electrically coupled to any light emitting element 25, and thus do not drive the light emitting element 25 to emit light; namely, the normal operation of the display backplane may not be affected.

If the bonding region and the bonding wiring region are not provided with the pixel circuits, the structure of the display backplane in the bonding region and the bonding wiring region and the structure in other regions of the display region are significantly different. For example, thicknesses of the backplane at different positions are different, and further, the luminance brightness of the display panel adopting the display backplane is uneven. By providing the dummy circuits 12 each having the same circuit structure as the pixel circuit 7 in the bonding region and the bonding wiring region, the circuit structure of the bonding region and the bonding wiring region may be consistent with that of the other regions of the display region, thereby ensuring the uniformity of the brightness of the display panel adopting the display backplane.

In some embodiments, the light emitting elements 25 in the display region are uniformly arranged in an array; and the pixel circuits 7 for the light emitting elements 25 located in the bonding region and the bonding wiring region are located outside the bonding region and the bonding wiring region, which ensures normal driving of the light emitting elements 25 located in the bonding region and the bonding wiring region. With the arrangement, the coupling effect generated between the bonding connection wires 6 and the bonding electrodes 5 and the conductive layers of the transistors in the pixel circuits 7 may be avoided, so that the influence of the coupling effect on the luminance brightness of the display panel is avoided, and the uniformity of the display brightness of the display panel is ensured.

In some embodiments, the dummy circuits 12 are uniformly arranged in an array; and n adjacent rows of the dummy circuits 12 form a dummy circuit group 120, where n is an integer, and $2 \leq n \leq 5$; in the dummy circuit group 120, a distance G between any two adjacent rows of dummy circuits 12 is greater than 0 and less than or equal to the distance M between two adjacent rows of light emitting elements 25. As shown in FIG. 12, in the dummy circuit group 120, the distance G between any two adjacent rows of dummy circuits 12 satisfies: $0 < G \leq M$. In some embodiments, the number of rows of the dummy circuits within the dummy circuit group 120 is equal to that of rows of the pixel circuits within one pixel circuit group 70", and each number is two. The distance G between two adjacent rows of the dummy circuits 12 is equal to the distance Si between two adjacent rows of the pixel circuits 7 in the pixel circuit group 70". With this arrangement, the arrangement of the dummy circuits 12 is also identical to that of the pixel circuits 7, so that the circuit structure of the bonding region and the bonding wiring region may be further kept to be consistent with that of other regions of the display region, thereby further ensuring the uniformity of the brightness of the display panel adopting the display backplane.

In some embodiments, a distance H between the dummy circuit group 120 and the pixel circuit group 70' adjacent to the dummy circuit group 120 is greater than the distance M between two adjacent rows of light emitting elements 25 and less than or equal to twice the distance M between two adjacent rows of light emitting elements 25. Namely, the distance H between the dummy circuit group 120 and the pixel circuit group 70' adjacent to the dummy circuit group 120 satisfies: M<H≤2M. If there are a plurality of dummy circuit groups 120, a distance X (not shown in the drawing) between two adjacent dummy circuit groups 120 satisfies: M<X≤2M. With the arrangement, the arrangement of the dummy circuits 12 is completely the same as that of the pixel circuits 7 in a region adjacent to the region where the dummy circuits 12 are arranged and the region where the pixel circuits 7 are arranged, so that the circuit structure of the bonding region and the bonding wiring region may be further kept to be consistent with that of other regions of the display region, thereby further ensuring the uniformity of the brightness of the display panel adopting the display backplane.

Other structures of the display backplane and the manufacturing method for the display backplane in this embodiment are the same as those in the above embodiments, and are not described herein again.

An embodiment of the present disclosure further provides a display backplane. Unlike the above embodiments, the data selection circuit may not be provided in the display backplane. That is, if the number of output data signal channels of the driving chip (IC) is enough according to the resolution of the display panel, the data selection circuit may not be provided. In a case where the data selection circuit is not provided, the data lines in the display backplane are coupled to the corresponding bonding electrodes through the bonding connection wires. Corresponding vias are formed in the insulating layer between the data lines and the bonding connection wires, and the data lines are coupled to the bonding connection wires through the vias. The vias may be formed in a region of the display region close to the bonding region, so that the wiring length of the bonding connection wires may be shortened, the resistance of the bonding connection wires is reduced, and the loss of transmission signals on the bonding connection wires is reduced; the vias may also be formed in a region of the display region where the pixel circuits are not arranged, which avoids the overlapping of the bonding connection wires and the conductive layers of the transistors in the pixel circuits, and ensures the uniformity of the display brightness.

Other structures of the display backplane and the manufacturing method for the display backplane in this embodiment are the same as those in the above embodiments, and are not described herein again.

According to the display backplane provided by the embodiments described above, the pixel circuits are located in a region of the display region than the bonding region and the bonding wiring region, which may avoid the overlapping of the bonding electrodes and the bonding connection wires with the conductive layers (such as the active layer and the gate electrode) of the transistors in the pixel circuits, and thus, may avoid the coupling effect generated between the bonding connection wires and the bonding electrodes and the conductive layers of the transistors in the pixel circuits, so that the influence of the coupling effect on the luminance brightness of the display panel is avoided, and the uniformity of the display brightness of the display panel is ensured. The orthographic projection of the first via on the base is located within the orthographic projection of an end of the bonding electrode on the base, which, on one hand, may reduce a wiring length of the bonding connection wire coupled to the bonding electrode through the first via, so that the resistance of the bonding connection wire is reduced, and the loss of transmission signals on the bonding connection wire is reduced; on the other hand, may reduce the distribution range of the bonding connection wires, which may avoid the overlapping with the conductive layers of the transistors in the pixel circuits, and ensure the uniformity of the display brightness. The orthographic projection of the shift register on the base is at least partially located within an orthographic projection of the bonding electrode, which provides a signal to the shift register, on the base, which, on one hand, may reduce a wiring length of the bonding connection wire connecting the shift register to the bonding electrode, so that the resistance of the bonding connection wire is reduced, and the loss of transmission signals on the bonding connection wire is reduced; on the other hand, may reduce the distribution range of the bonding connection wires, which may avoid the overlapping with the conductive layers of the transistors in the pixel circuits, and ensure the uniformity of the display brightness of the display panel adopting the display backplane. The one or more data selection circuits are arranged in a region of the display region close to the bonding region, which, on one hand, may significantly reduce a wiring length of the bonding connection wire connecting the data selection circuit to the bonding electrode, so that the resistance of the bonding connection wire is reduced, and the loss of transmission signals on the bonding connection wire is reduced; on the other hand, may significantly reduce the distribution range of the bonding connection wires, which may avoid the bonding connection wire overlapping with the conductive layers of the transistors in the pixel circuits, and ensure the uniformity of the display brightness.

In a second aspect, an embodiment of the present disclosure further provides a display device, including the display backplane in any of the embodiments.

By adopting the display backplane in any of the above embodiments, the uniformity of the display brightness of the display device is improved.

The display device provided by the embodiment of the present disclosure may be any product or component with a display function, such as an OLED panel, an OLED television, a Micro LED panel, a Micro LED television, a display, a mobile phone, a navigator and the like.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display backplane, comprising a base, and
a plurality of pixel circuits, a plurality of bonding electrodes, and a plurality of bonding connection wires on the base, wherein
the plurality of bonding electrodes are coupled to the plurality of bonding connection wires in a one-to-one correspondence;
the plurality of bonding electrodes and the plurality of bonding connection wires are on two opposite surfaces of the base, respectively,
the plurality of pixel circuits and the plurality of bonding connection wires are on a same side of the base;
one end of each of the plurality of bonding connection wires is coupled to the bonding electrode through a first via in the base;
the other end of each of at least some of the plurality of bonding connection wires is coupled to the pixel circuit; and
an orthographic projection of at least one of the plurality of bonding electrodes and the plurality of bonding connection wires on the base is not coincident with an orthographic projection of the pixel circuit on the base,
wherein the display backplane further comprises a plurality of dummy circuits on the base, and
wherein the orthographic projection of at least one of the plurality of bonding electrodes and the plurality of bonding connection wires on the base overlaps an orthographic projection of at least one of the plurality of dummy circuits on the base.

2. The display backplane of claim 1, wherein the dummy circuit has a same circuit structure as the pixel circuit.

3. The display backplane of claim 2, further comprising a plurality of light emitting elements arranged in a uniform array,
wherein the plurality of pixel circuits are coupled to the plurality of light emitting elements in a one-to-one correspondence;
in an array of the plurality of pixel circuits, every n adjacent rows of pixel circuits form a pixel circuit group; where n is an integer, and $2 \leq n \leq 5$;
a distance between any two adjacent rows of the light emitting elements along a column direction in which the plurality of pixel circuits are arranged is M, and in the pixel circuit group, a distance S between any two adjacent rows of the pixel circuits satisfies: $0 < S \leq M$; and
a length of the bonding electrode along the column direction in which the plurality of pixel circuits are arranged is L, and a distance T between two adjacent pixel circuit groups satisfies: $M < T \leq (2 \cdot p + 1) \cdot M$, where $p = [L/M]$.

4. The display backplane of claim 3, wherein the plurality of dummy circuits are arranged in a uniform array,
every n adjacent rows of the dummy circuits form a dummy circuit group, where n is an integer, and $2 \leq n \leq 5$; and
in the dummy circuit group, a distance G between any two adjacent rows of the dummy circuits satisfies: $0 < G \leq M$.

5. The display backplane of claim 4, wherein a distance H between the dummy circuit group and the pixel circuit group adjacent thereto satisfies: $M < H \leq 2M$; and
a distance X between any two adjacent dummy circuit groups satisfies: $M < X \leq 2M$.

6. The display backplane of claim 3, wherein the pixel circuit comprises at least a capacitor and a thin film transistor electrically coupled to each other.

7. A display backplane, comprising a base, and
a plurality of pixel circuits, a plurality of bonding electrodes, and a plurality of bonding connection wires on the base, wherein
the plurality of bonding electrodes are coupled to the plurality of bonding connection wires in a one-to-one correspondence;
the plurality of bonding electrodes and the plurality of bonding connection wires are on two opposite surfaces of the base, respectively,
the plurality of pixel circuits and the plurality of bonding connection wires are on a same side of the base;
one end of each of the plurality of bonding connection wires is coupled to the bonding electrode through a first via in the base;
the other end of each of at least some of the plurality of bonding connection wires is coupled to the pixel circuit; and
an orthographic projection of at least one of the plurality of bonding electrodes and the plurality of bonding connection wires on the base is not coincident with an orthographic projection of the pixel circuit on the base,
wherein an orthographic projection of the first via on the base is within an orthographic projection of an end of the bonding electrode on the base.

8. The display backplane of claim 7, wherein the first via comprises a plurality of first vias,
the plurality of first vias are at two ends of the bonding electrode, respectively; and
the plurality of first vias are sequentially arranged along a length direction of the bonding electrode.

9. The display backplane of claim 8, wherein the first via comprises N first vias, N is an even number,
N/2 of the N first vias are correspondingly disposed at one end of the bonding electrode, and
the other N/2 of the N first vias are correspondingly disposed at the other end of the bonding electrode.

10. The display backplane of claim 9, wherein the plurality of pixel circuits are on a side of the plurality of bonding connection wires away from the base,
the display backplane further comprises a first insulating layer between the plurality of pixel circuits and the plurality of bonding connection wires,
the first insulating layer is provided with a second via therein, and
the pixel circuit is coupled to the bonding connection wire through the second via.

11. The display backplane of claim 10, further comprising a shift register on a side of the bonding connection wire away from the base,
wherein an orthographic projection of the shift register on the base is at least partially within an orthographic projection of the bonding electrode for providing a signal to the shift register on the base; and
one end of the shift register is coupled to the bonding electrode through the bonding connection wire, and the other end of the shift register is coupled to the pixel circuit.

12. The display backplane of claim 11, wherein the shift register is in the same layer as the plurality of pixel circuits, and is between two adjacent columns of pixel circuits;
the first insulating layer further extends between the shift register and the bonding connection wire,
the first insulating layer is further provided with a third via therein, and the shift register is coupled to the bonding connection wire through the third via, so as to be coupled to the bonding electrode through the bonding connection wire.

13. The display backplane of claim 12, further comprising a data selection circuit,
wherein an orthographic projection of the data selection circuit on the base partially overlaps an orthographic projection of the bonding connection wire on the base,
one end of the data selection circuit is coupled to the bonding electrode through the bonding connection wire, and the other end of the data selection circuit is coupled to a data line; and
the data line is configured to couple the pixel circuit to the data selection circuit.

14. The display backplane of claim 13, wherein the data selection circuit is on a side of the plurality of bonding connection wires away from the base,
the data selection circuit is on a same layer as the plurality of pixel circuits,
the data selection circuit, the plurality of pixel circuits and the shift register are not aligned with each other;
the first insulating layer further extends between the data selection circuit and the plurality of bonding connection wires,
the first insulating layer is provided with a fourth via therein, and
the data selection circuit is coupled to the bonding connection wire through the fourth via, so as to be coupled to the bonding electrode through the bonding connection wire.

15. The display backplane of claim 14, wherein the plurality of bonding electrodes are arranged along a row direction in which the plurality of pixel circuits are arranged, and a length direction of each of the plurality of bonding electrodes is parallel to a column direction in which the plurality of pixel circuits are arranged; and
a shape of the data selection circuit comprises a long strip shape, and a length direction of the data selection circuit is parallel to the row direction in which the plurality of pixel circuits are arranged.

16. The display backplane of claim 15, wherein the data selection circuit comprises a plurality of data selection circuits parallel to each other and sequentially arranged along the column direction in which the plurality of pixel circuits are arranged.

17. A display device, comprising the display backplane of claim 1.

18. A method for manufacturing a display backplane, comprising:
sequentially preparing a plurality of bonding electrodes, a base, a first via in the base, a plurality of bonding connection wires, and a plurality of pixel circuits on a substrate;
wherein the plurality of bonding electrodes are coupled to the plurality of bonding connection wires in a one-to-one correspondence;
the plurality of bonding electrodes and the plurality of bonding connection wires are on two opposite surfaces of the base, respectively,
the plurality of pixel circuits and the plurality of bonding connection wires are on a same side of the base;
one end of each of the plurality of bonding connection wires is coupled to the bonding electrode through the first via;
the other end of each of at least some of the plurality of bonding connection wires is coupled to the pixel circuit; and
wherein the orthographic projection of at least one of the plurality of bonding electrodes and the plurality of bonding connection wires on the base overlaps an orthographic projection of at least one of the plurality of dummy circuits on the base,
wherein the display backplane further comprises a plurality of dummy circuits on the base, and
wherein the orthographic projection of at least one of the plurality of bonding electrodes and the plurality of bonding connection wires on the base overlaps an orthographic projection of at least one of the plurality of dummy circuits on the base.

19. The method of claim 18, further comprising a step of peeling off the substrate.

* * * * *